US009288848B2

(12) United States Patent
Theodore

(10) Patent No.: US 9,288,848 B2
(45) Date of Patent: Mar. 15, 2016

(54) APPARATUS FABRICATION USING LOCALIZED ANNEALING

(71) Applicant: Nirmal David Theodore, Mesa, AZ (US)

(72) Inventor: Nirmal David Theodore, Mesa, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 13 days.

(21) Appl. No.: 14/144,720

(22) Filed: Dec. 31, 2013

(65) Prior Publication Data
US 2015/0182995 A1     Jul. 2, 2015

(51) Int. Cl.
*H01L 21/00* (2006.01)
*B05B 5/00* (2006.01)
*H05B 6/64* (2006.01)
*H01L 21/67* (2006.01)

(52) U.S. Cl.
CPC ........ *H05B 6/6491* (2013.01); *H01L 21/67115* (2013.01)

(58) Field of Classification Search
CPC ............ H01L 27/1281; H01L 27/3146; H01L 27/02697; H01L 27/02675; H01L 27/02669
USPC ............ 438/799; 118/641; 427/559; 219/759
See application file for complete search history.

(56) References Cited

U.S. PATENT DOCUMENTS

| 6,355,543 | B1 * | 3/2002 | Yu ..................... H01L 21/26506 257/E21.335 |
| 2004/0053452 | A1 * | 3/2004 | Hasegawa ........... H01L 21/2026 438/151 |
| 2004/0232583 | A1 * | 11/2004 | Monsheimer et al. ........ 264/113 |
| 2006/0228897 | A1 * | 10/2006 | Timans ......................... 438/758 |
| 2009/0253273 | A1 * | 10/2009 | Sano ................. H01L 21/02683 438/795 |

OTHER PUBLICATIONS

Bob Lojek. "Low Temperature Microwave Annealing of S/D." 16th IEEE International Conference on Advanced Thermal Processing of Semiconductors. 2008.
Jeff M. Kowalski, Kowalski, Jeff E., Lojek, Bob. "Microwave Annealing for Low Temperature Activation of As in Si." IEEE International Conference on Advanced Thermal Processing of Semiconductors. 2007.
P. Livshits, Dikhtyar, V., Inberg, A., Shahadi, A., Jerby, E. "Local doping of silicon by a point-contact microwave applicator." Microelectronic Engineering. Jun. 23, 2010. pp. 2831-2836. vol. 88. Elsevier.

(Continued)

*Primary Examiner* — Caridad Everhart
(74) *Attorney, Agent, or Firm* — Valerie M. Davis; The Mason Group Patent Specialist LLC

(57) ABSTRACT

A method for fabricating an apparatus using radiation annealing includes forming an annealable layer on a substrate. A radiation absorbing layer is also formed on the substrate, wherein the radiation absorbing layer heats up In response to radiation, and the radiation absorbing layer is formed adjacent to at least a portion of the annealable layer and non-adjacent to a portion of the apparatus. Radiation is directed toward the apparatus to heat up the radiation absorbing layer to anneal the at least a portion of the annealable layer that is adjacent to the radiation absorbing layer without annealing the portion of the apparatus that is non-adjacent to the radiation absorbing layer.

18 Claims, 14 Drawing Sheets

(56) References Cited

OTHER PUBLICATIONS

Patrick W. Fink, Lin, Gregory Y., Chu, Andrew W., Dobbins, Justin A., Arndt, G. Dickey, and Ngo, Phong. "Compact Directional Microwave Antenna for Localized Heating." NASA Tech Briefs. Mar. 2008. pp. 18-19.

T. L. Alford, Thompson, D. C., Mayer, J. W., David Theodore, N. "Dopant activation in ion implanted silicon by microwave annealing." Journal of Applied Physics. Dec. 1, 2009. pp. 114902. vol. 106. The American Institute of Physics.

Yao-Jen Lee, Lu, Yu-Lun, Hsueh, Fu-Kuo, Huang, Kuo-Chin, Wan, Chia-Chen, Cheng, Tz-Yen, Han, Ming-Hung, Kowalski, Jeff M., Kowalski, Jeff E., Heh, Dawai, Chuang, Hsi-Ta, Li, Yiming, Chao, Tien-Sheng, Wu, Ching-Yi, and Yang, Fu-Liang. "3D 65nm CMOS with 320° C. Microwave Dopant Activation." IEEE. 2009.

\* cited by examiner

APPARATUS FABRICATION USING LOCALIZED ANNEALING

FIELD

The present disclosure relates generally to apparatus fabrication and more particularly to apparatus fabrication using localized annealing by radiation.

BACKGROUND

Annealing, an anneal, and derivatives thereof, refers herein to a heating treatment that uses thermal energy to alter a material by changing its atomic structure. Annealing is used in many applications. Such applications include, by way of example, electrical activation of ion implanted dopants within substrates such as silicon wafers, silicidation, local reactions between materials, localized bonding of materials, solid phase epitaxy, etc.

Current annealing processes include: furnace or oven heating; rapid thermal processing (RTP) methods that use lamp and laser heating; and microwave heating. However, the current annealing processes expose an entire substrate or other structure to heating, oftentimes at comparatively high temperatures, even when only a portion of the substrate or structure requires the anneal treatment or procedure. This can result in, for example, inter-diffusion of materials in places where inter-diffusion is undesirable, substrate or structure warpage, and/or inter-reactions of materials in places where inter-reactions are undesirable.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 2:
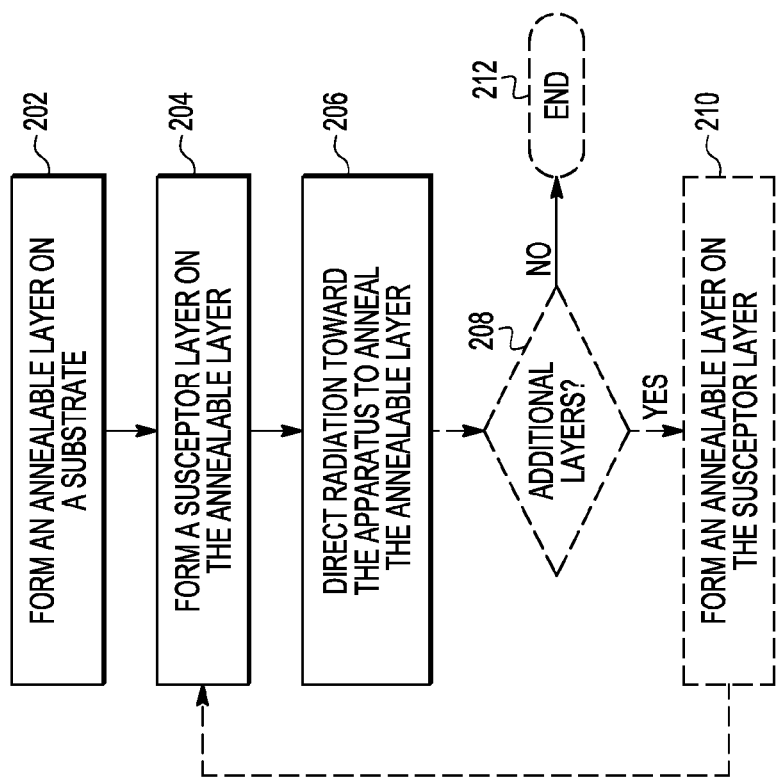
FIG. 2 is a flow diagram illustrating a method for apparatus fabrication using localized annealing by radiation, in accordance with another embodiment.

The present disclosure is illustrated by way of example and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

In accordance with an embodiment is a method for fabricating an apparatus using radiation annealing. The method includes forming an annealable layer on a substrate and forming a radiation absorbing layer on the substrate. The radiation absorbing layer heats up in response to radiation, and the radiation absorbing layer is formed adjacent to at least a portion of the annealable layer and non-adjacent to a portion of the apparatus. The method further includes directing radiation toward the apparatus to heat up the radiation absorbing layer to anneal the at least a portion of the annealable layer that is adjacent to the radiation absorbing layer without annealing the portion of the apparatus that is non-adjacent to the radiation absorbing layer. In accordance with another embodiment is an apparatus that includes a structure having an annealed section and a non-annealed section. The apparatus further includes susceptor material that is integral to the apparatus and positioned adjacent to the annealed section such that the annealed and non-annealed sections are defined by a shape of the susceptor material, wherein the annealed section was formed from material that was annealed at a temperature at least partially due to heat from the susceptor material's exposure to radiation.

Accordingly, embodiments of the present disclosure describe apparatus, such as electrical or electronic apparatus, and a method of fabricating such apparatus to include one or more radiation absorbing layers, comprising susceptor material, formed in the apparatus. Each radiation absorbing layer is positioned within the apparatus to selectively anneal one or more annealable layers or portions of the annealable layers, also formed on the apparatus, without heating other areas of the apparatus that do not require annealing. Thermal energy for the annealing is provided by radiation including, but not limited to, microwave radiation; and the susceptor material of the radiation absorbing layers can be tailored to the frequency of the radiation. Accordingly, the deleterious effects of undesired heating of regions not needing annealing and/or of overheating regions that require annealing can be avoided or minimized.

Some disclosed embodiments include shaping of the radiation absorbing layer(s) and/or the annealable layer(s) to be annealed to, for instance, fabricate a variety of different device structures. Moreover, the shaping enables the annealing of regions having different configurations within a particular layer, e.g., spots or dots, lines, and planes or other two-dimensional shapes, as well as the annealing of multiple layers of a stacked arrangement built up of annealable layers, in accordance with the disclosed methods. Furthermore, the radiation absorbing layer(s) can provide micron or nanometer scale annealing of adjacent annealable layer regions.

Disclosed embodiments can be used for annealing over a range of temperatures and applications including low temperature fabrication procedures. Particular uses of the present teachings include fabricating devices or apparatus with one or more layers, structures, components, or other portions having different thermal budgets. For example, apparatus fabricated according to at least one embodiment includes a lower layer that has a lower thermal budget than an upper layer, which is not possible with conventional anneal procedures. The disclosed embodiments can, thus, be used to individually optimize each anneal procedure to avoid exceeding the thermal budget of any segment of the apparatus. Such separate optimization of the anneal procedures allows higher or later formed layers to receive higher amounts of energy than any one or more of the lower or previously formed layers.

Figure 1:
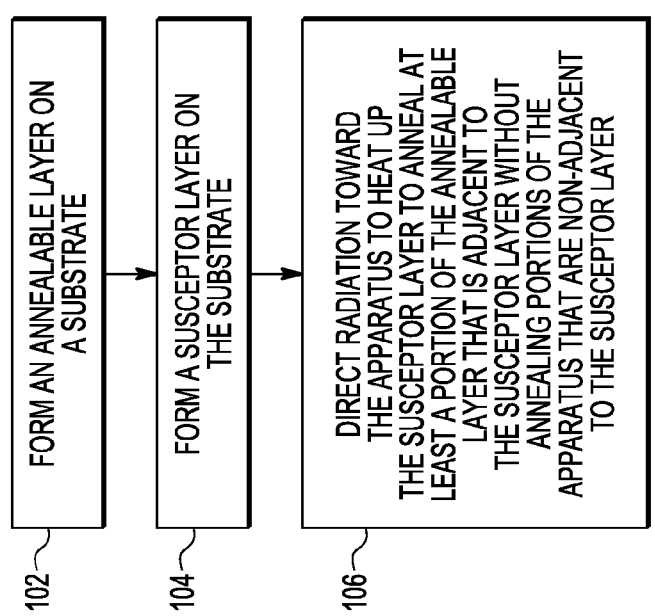
FIG. 1 is flow diagram illustrating a method for apparatus fabrication using localized annealing by radiation, in accordance with an embodiment.

FIG. 1 illustrates a flow diagram showing a method 100 for fabricating an apparatus that has formed, therein, one or more radiation absorbing layers in accordance with an embodiment. Method 100, and the methods illustrated by reference to FIGS. 2, 4, 6, 8, 10, and 13, can be used while fabricating an integrated circuit (IC), for instance, or other electrical or electronic apparatus, devices, or components. The IC can be fabricated on an IC chip or die formed (e.g., singulated) from a wafer. Accordingly, in an embodiment, the apparatus is fabricated starting with a substrate, which is a base material or substance upon which one or more additional layers of materials are formed. A layer, as used herein, is an adding of molecules of a material on, to, or within the substrate by growing (e.g., oxidation), deposition, ion implantation, etc., such that the molecules adhere to or become a part of the substrate or one or more other layers formed on the substrate. Further, as used herein, a layer being "formed on," "over," and "supported by" the substrate and a layer being formed or included in the apparatus means that material that makes up the layer is formed on or within the apparatus itself so that the material is integral to and no longer separate from the apparatus. This includes a layer being directly formed on or within the substrate or there being one or more intermediate layers formed between a particular layer and the substrate.

In this embodiment and those described below by reference to the remaining FIGS. 2, 4, 6, 8, 10, and 13, the method includes a sequence of acts or functions, only the salient of which are depicted for convenience in illustration. Accordingly, additional acts implemented at various points in the fabrication process and used to fabricate all of the layers of an IC such as various metal, passivation and/or other layers supported by the substrate are not shown for the sake of brevity. In addition, the ordering of the acts can vary in different embodiments. For example, an annealable layer is formed on the substrate before a radiation absorbing layer in some embodiments, for instance as shown and described below by reference to FIGS. 3, 7, 11, 12, 14 and 15. However, the order in which radiation absorbing and annealable layers are formed is reversed in some embodiments, examples of which are described below by reference to FIGS. 5 and 9. Moreover, multiple annealable and radiation absorbing layers can be fabricated to form a stack of layers, for instance as described below by reference to FIGS. 3, 5, 7, and 9. In addition, the disclosed embodiments are compatible with a variety of process technologies and/or die technologies. Furthermore, the disclosed embodiments are not limited to any particular transistor or other device, structure, or component configuration, and the transistor and other devices are also not limited to a particular type of charge carrier or conductivity type.

Returning to the substrate description, in a particular embodiment, the substrate comprises a material that is substantially transparent to applied radiation, meaning that radiation substantially passes through the substrate as opposed to being absorbed by the substrate. Accordingly, since the radiation is not strongly absorbed by the substrate, substantially no heat is generated in the substrate as a result of the radiation. Additionally, the disclosed embodiments are not limited to any particular substrate material. In some embodiments, the substrate material is simply more transparent than absorptive but not absorptive enough to generate the heat required to anneal annealable layers within the apparatus.

Thus, the disclosed apparatus can be fabricated and methods can be implemented using a variety of different substrates. For example, a variety of semiconductor materials can be used, including elementary semiconductors, such as Si, for instance, in the form of a bulk silicon wafer, and compound semiconductors, such as GaAs. Other compound and non-compound semiconductor materials can be used, and the substrate can be a lightly or heavily doped p-type or n-type substrate. Moreover, the construction of the substrates of the disclosed apparatus can also vary, and alternatively or additionally, the substrate includes non-semiconductor materials. For example, the substrates can be configured as silicon-on-insulator substrates or as semiconductor-on-insulator substrates.

In some cases, the substrate is a composite substrate with any number of layers, e.g., epitaxial layers. For example, the substrate can include an original p-type semiconductor substrate on which insulator, epitaxial, or other layers are grown or otherwise formed. In one example, an n+ buried layer is formed before the growth of the epitaxial layer(s) to achieve a depth that may not be possible or practical via an implantation-based procedure. Alternatively or additionally, such insulator, epitaxial, or other layers are grown or formed, at a later stage of the fabrication process, in or as one or more annealable layers supported by the substrate. The localized annealing of the disclosed embodiments may be used for dopant activation, lattice repair, or other purposes in connection with such layers.

Turning now to the method 100, one or more annealable layers are formed 102 on or over and, thereby, supported by the substrate, wherein at least one of the annealable layers is the target of an anneal procedure or process. The targets of the anneal procedure and, thus, the composition, configuration, and other characteristics of the annealable layer can vary considerably. Examples of annealable layers include, but are not limited to: ion-implanted and otherwise doped substrate or semiconductor layers or, in other words, a semiconductor or substrate material having an electrically activated dopant; one or more constituent layers to be reacted, bonded, or otherwise processed with an adjacent layer of a different material type (which may or may not be part of the annealable layer) or, in other words, a first constituent layer to be bonded to a second constituent layer; and/or one or more dielectric, passivation, silicide, or other layers to be deposited, grown, implanted, or otherwise layered or formed on a substrate. The annealable layer can thus include a variety of materials, including, for example, semiconductors, metals, dielectric materials, organic material, non-organic material, and various combinations thereof. Additionally, one or more of the annealable layers can, but need not be, substantially transparent to applied radiation and in some embodiments are more transparent than absorptive such that radiation passes through or substantially passes through the annealable layer.

The annealable layer can, but need not be, configured as a uniform layer or a stack of uniform layers. Moreover, in various embodiments, the annealable layer includes any number of device structures or other structures or components, defined therein, formed on the substrate. The device structures can be, for instance, configured to define a number of transistor or other semiconductor devices formed on the substrate. In one example implementation, the semiconductor devices are disposed in a circuit arrangement that extends laterally across a surface of the substrate. The device structures can be formed by doping regions of the substrate via, for instance, an implantation procedure. Such regions may correspond with source regions, drain regions, device body regions, and other semiconductor device regions, and are not limited to any particular device type.

Formation of the device structures using the one or more annealable layers need not involve doping the substrate, however. In one example implementation, the device structures include shallow trench isolation (STI) regions and interconnects defined and formed therein according to the present teachings. Device structures can also be partially or otherwise formed on or above the surface of the substrate using the one or more annealable layers. For example, gate structures, silicide blocks, and other structures supported by the substrate can be formed. Furthermore, any number of such device structures, both semiconductor and non-semiconductor, can be formed on and supported by the substrate, and arranged in any number of layers, including, for instance, one or more of the layers supported by the substrate that are annealed in accordance with the disclosed embodiments.

In accordance with some embodiments, the one or more annealable layers can be internally shaped and/or otherwise configured to define one or more boundaries and, thus, a size and shape of the one or more annealable layers to create a variety of structures, devices, or other components. Such devices, include, for instance, resistors, capacitors, diodes, transistors, light emitting diodes (LEDs), light emitting transistors (LETs), femto cells, solar cells, flexible electronics, infrared (IR) sensors or detectors, ultraviolet (UV) sensors or detectors, electrochromic devices, liquid crystal display (LCD) devices, and charge coupled devices (CCDs). Such devices and/or device regions and, thus, the constituent annealable layer(s) can include organic and/or non-organic materials. Furthermore, the configuration of the transistor devices can vary and include, for example, bipolar junction transistor (BJT) devices, field effect transistor (FET) devices, metal-oxide-semiconductor FET (MOSFET) devices, metal-insulator-semiconductor FET (MISFET) devices, junction gate field-effect transistor (JFET) devices, insulated gate bipolar transistor (IGBT) devices, organic field-effect transistors (OFET) devices, metal-semiconductor FET (MESFET) devices, and thin-film transistor (TFT) devices. Embodiments illustrating the shaping of an annealable layer are shown and described below by reference to FIGS. 14 and 15.

Returning to method 100, the fabrication process further includes forming 104 one or more radiation absorbing layers on or over and, thereby, supported by the substrate. The radiation absorbing layers are formed using radiation absorbing material, which is also referred to herein as susceptor material. In general, the susceptor material used to form the one or more radiation absorbing layers has a higher radiation absorption capability than any of the annealable layers in the apparatus and, in an embodiment, a higher radiation absorption capability than the substrate. Accordingly, susceptor material is configured using one or more constituent materials to absorb radiation to a greater degree than any of the annealable layers in the apparatus. Examples of susceptor material include, but are not limited to $Fe_3O_4$ infused $Al_2O_3$, $Fe_3O_4$, $Al_2O_3$, $Al_2O_3$ infused with thin metal (e.g., W or Al or Cu) flakes, $SiO_2$ or other dielectric infused with metal flakes, or infused with metal nanoparticles, SiC, $BaTiO_3$, nanoporous dielectric infused with moisture, polyethylene/nanoparticle-$Fe_3O_4$ nanocomposite, MoS, ZnO, $ZrO_3$, chlornaphthlene, chloroprene rubber, $SrTiO_3$, tri-chlordiphenyl compound, cellophane, $PbZrO_3$, $CaCO_3$, $NaCaSiO_x$, parylene C, polyvinylchloride, $TiO_2$, aniline resin, nylon, cellulose acetate, nitrile rubber, neoprene rubber, cellulose fibers, asbestos chrysotile, $Na_2SiO_3$ soda glass or combinations thereof such as, by way of example only, $Fe_3O_4$ infused $Al_2O_3$. In a particular embodiment, the type of radiation absorbing material used depends, at least in part, on the frequency of radiation used in the anneal procedures, as described below in further detail.

Each radiation absorbing layer is formed and positioned in the apparatus adjacent to at least one annealable layer or a portion, area, section, or segment thereof, which requires an annealing procedure or process. Radiation is directed 106 toward the apparatus to anneal portions of annealable layers that are positioned adjacent to a susceptor layer without annealing portions of the apparatus that are non-adjacent to a susceptor layer. The radiation is directed toward the apparatus to heat up the susceptor layer to anneal the at least a portion of the annealable layer that is adjacent to the susceptor layer without annealing the portion of the apparatus that is non-adjacent to the susceptor layer. One or more of the radiation absorbing layers can create a part of the device or apparatus structures further created by the one or more annealable layers also supported by the substrate, such as any one or more of the structures listed above. In other embodiments, the one or more radiation absorbing layers do not form a part of such structures but are fabricated in the apparatus for the sole purpose of annealing one or more annealable layers or parts thereof. Moreover, in at least one embodiment, radiation is absorbed by the susceptor layer while passing through or substantially passing through at least some other section, e.g., a non-annealed section, of the apparatus.

Here, an annealable layer and a radiation absorbing layer being positioned adjacent to each other means that the annealable layer is in close enough proximity to the radiation absorbing layer that heat generated by the radiation absorbing layer as a consequence of radiation directed at the apparatus is sufficient to anneal the annealable layer or portions, areas, sections, or segments thereof, as needed. Conversely, where a portion, area, section, or segment of the apparatus is non-adjacent to a radiation absorbing layer, that non-adjacent portion, area, section, or segment of the apparatus does not receive heat sufficient to anneal the non-adjacent portion, area, section, or segment of the apparatus and/or substantially no heat from the radiation absorbing layer reaches, impacts, and/or affects the non-adjacent portion, area, section, or segment of the apparatus.

In one particular embodiment, an entire annealable layer is positioned in the apparatus adjacent to a radiation absorbing layer. In this embodiment, neither the radiation absorbing layer nor the annealable layer is shaped to define boundaries of the layers. Instead, a radiation absorbing layer is configured as a blanket or uniform layer that extends across the full extent of the annealable layer. Such lack of patterning can, thus, provide universal annealing of the underlying or overlaying annealable layer using radiation directed at the layers. Accordingly, this embodiment results in annealing across an entire two-dimensional area presented by the annealable layer. In a further embodiment, a blanket anneal across an entire substrate, die and/or wafer is implemented using this particular embodiment. Examples of such blanket anneals are shown and described below by reference to FIGS. 3, 5, 7, and 9.

In another embodiment, only part of an annealable layer is positioned adjacent to the radiation absorbing layer in order to selectively anneal only a portion of the annealable layer. In this embodiment, forming the radiation absorbing layer on the substrate includes positioning radiation absorbing material adjacent to a first portion of the annealable layer and non-adjacent to a second portion of the annealable layer, such that the first portion of the annealable layer is annealed using the radiation without annealing the second portion of the annealable layer. This positioning can be accomplished by shaping the annealable layer, the radiation absorbing layer, or both. Shaping of only the radiation absorbing layer is shown and described by reference to FIGS. 11 and 12. Shaping of both an annealable layer and a radiation absorbing layer is shown and described by reference to FIGS. 14 and 15. The shaping or positioning can be accomplished using any suitable means to form or configure the annealable and/or radiation absorbing layer into a certain shape or physical configuration. Accordingly, procedures including, but not limited to, any one or a combination of deposition, direct write methods, etching, polish back methods, removal methods, or patterning of material, e.g., by photo lithographic processes, can be used to shape the annealable layer and/or the radiation absorbing layer.

In an embodiment, the shaped radiation absorbing layer defines one or more boundaries to selectively anneal only certain sections of an annealable layer. A variety of different layouts are achievable by forming or shaping a radiation absorbing layer. For example, the susceptor material used to create the radiation absorbing layer is configured or formed to have one or more of the following shapes: a zero-dimensional or quasi (i.e., substantially) zero-dimensional shape; a one-dimensional or quasi one-dimensional shape; a two-dimensional or quasi two-dimensional shape; or a three-dimensional or quasi three-dimensional shape, e.g., multiple stacked layers of susceptor material. The apparatus fabricated using methods of the present teachings in accordance with this embodiment includes a non-annealed section. The apparatus further includes an annealed section that is generated using the radiation and includes the section(s) of the annealable layer adjacent to the susceptor material, wherein the annealed and non-annealed sections are defined by the shape of the radiation absorbing layer.

Accordingly, the shaping of the susceptor material can define an annealed area, section, or region in the shape of, for instance: one or more two-dimensional or quasi two-dimensional shapes that are smaller than a total area of an adjacent annealable layer; one or more stripes or lines (one-dimensional or quasi one-dimensional areas); or one or more spots or dots (zero-dimensional or quasi zero-dimensional areas). For example, on an IC: susceptor material having a zero-dimensional shape can be used to anneal a single structure or device; susceptor material having a one-dimensional shape can be used to anneal a line of devices or structures; or susceptor material having a two-dimensional shape can be used to anneal a block of devices or structures. Alternatively, as mentioned above, the annealable layer is annealed in an entire plane or other two-dimensional shape or in a three-dimensional stack of planes or other two-dimensional shapes.

As mentioned above, radiation is directed 106 toward the substrate and the annealable and radiation absorbing layers to anneal one or more of the annealable layers or parts thereof. The wavelength (or frequency) of the radiation and/or the material(s) of a given radiation absorbing layer can be selected such that the radiation is absorbed by the radiation absorbing layer in an amount sufficient to generate the heat necessary to anneal at least a segment of one or more annealable layers of the apparatus. In some embodiments, the radiation is microwave radiation. In such cases, the microwave photon energies may fall in a range from about 1.24 µeV to about 1.24 meV. Alternatively or additionally, other wavelengths or wavelength ranges may be used. However, the disclosed embodiments are not limited to any particular radiation wavelength or corresponding frequency range. Various types of radiation, e.g., ultrahigh frequency (UHF), infrared, visible, ultraviolet, etc., can be used along the electromagnetic spectrum, for example. In particular embodiments, the radiation wavelength or frequency is tailored for absorption by a particular susceptor material used to construct the radiation absorbing layers.

In general, materials resonate at certain frequencies due to one or more different heating properties, and one can tailor the susceptor material to particular frequencies as a consequence of the susceptor material's heating properties. For example, radiation heating of a given susceptor material can result from electronic or ionic conduction and dipole polarization losses, which vary with frequency. In ionic susceptor materials such as BaTiO3, $Fe_3O_4$, MoS, ZnO, $ZrO_2$, $SrTiO_3$, $PbZrO_3$, $CaCO_3$, $TiO_3$, for instance, ionic conduction losses or vibrational losses are prominent. In the presence of an electric field, electrons move freely inside conductors resulting in electric current and ohmic heating. In dielectric materials such as $Al_2O_3$ or $SiO_2$ for instance, electrons do not move freely but, instead, reorientation of induced dipoles gives rise to heating. Ions can also move between vacant sites and interstitial positions within the lattice network. Moreover, at higher frequencies, vibrational losses from the vibration of ions become important.

Moreover, in the presence of an electric field, the electron cloud in the atom can be displaced with respect to the nucleus, leaving negative charges at one side and positive charges at the other side of the atom. An electric dipole moment is created as a result of the displacement of the uncompensated charges. The summation of the dipoles gives the polarization over a unit volume, which can be used to determine which frequency of radiation is best suited for susceptor materials that heat up as a result of dipole polarization losses. Accordingly, the same susceptor material can experience and/or produce different heating properties at different frequencies of radiation; and different susceptor materials at the same or different frequencies of radiation can experience and/or produce different heating properties. As mentioned previously, these heating properties allow the designing of radiation absorbing layers to absorb specific frequencies of radiation that are not absorbed by the annealable layers or annealable layer portions needing annealing.

The ability of a material to absorb electrical potential energy from the radiation field is determined by its complex permittivity. The real part of the permittivity, the depth of penetration of the radiation into the material, and the dielectric loss factor, factor into the material's ability to store the energy. tan δ, the loss tangent, is a measure of the capability of material to convert the field or energy absorbed into heat. So, the dielectric constant and the dielectric loss factor are properties that determine the absorption capability of the material. Materials with a high dielectric loss factor can better absorb radiation.

For radiation that provides volumetric heating, the power absorbed per unit volume is given by equation (1) below:

$$P_{abs} = \sigma_{eff}|E|^2 \quad (1)$$
$$= \omega \in_0 \in_{eff} |E|^2$$
$$= \omega \in_0 \in_r \tan\delta|E|^2,$$

wherein:
E is the magnitude of the internal electric field;
$\in_{eff}$ is the relative effective dielectric loss factor;
$\in_0$ is the permittivity of free space;
ω is the radiation frequency;
$\sigma_{eff}$ is the total effective conductivity;
$\in_r$ is the relative dielectric constant; and
tan δ is the energy loss required to store a given quantity of energy.

Equation (1) takes into account ionic conduction losses and dipole polarization losses that create the overall radiation loss mechanism responsible for absorption of radiation energy.

In an example implementation scenario, a Si substrate sample, having a low dielectric constant/permittivity, is not heated very much by microwave radiation. However, forming a high dielectric microwave-absorbing susceptor material on the substrate such as a susceptor material made of SiC capped $Fe_2O_3$ infused alumina, for instance, can facilitate with the heating. This susceptor material has a high dielectric constant and when subjected to microwave radiation experiences a rapid heating rate. In one particular use case, a Si substrate sample is implanted with $As^+$ dopant atoms, resulting in the local destruction of the silicon crystalline structure. However, further heating using the SiC capped $Fe_2O_3$ infused alumina material, formed on the substrate, under microwave radiation can recrystallize the Si, thereby, successfully healing the damaged silicon structure, while also controlling further diffusion of the arsenic. Accordingly, annealing the damaged Si substrate using a susceptor material formed on the substrate in accordance with the present teachings, can supply heat to the Si sample in a conductive manner so that the sample reaches the temperatures required for recrystallization and undergoes uniform damage repair due to uniform absorption of microwaves.

In a further embodiment, where multiple radiation absorbing layers are formed in a particular apparatus, the different radiation absorbing layers can have the same or different radiation absorption capabilities. In one example implementation, the susceptor material of an apparatus makes up a first susceptor (radiation absorbing) layer that is adjacent to a first section of a first annealable layer formed on a substrate. The first susceptor layer is configured with a first dielectric loss factor that generates a first absorption capability, which corresponds to a frequency of the radiation used to generate an annealed section of the apparatus. Moreover, the apparatus further includes a second annealable layer formed on the substrate, wherein the susceptor material makes up a second susceptor layer that is adjacent to a first section of the second annealable layer. The second susceptor layer is configured with a second dielectric loss factor that generates a second absorption capability, which corresponds to the frequency of the radiation used to generate the annealed section of the apparatus.

In accordance with this particular implementation, the method 100 can be used to fabricate apparatus in which regions, layers, or other portions of the apparatus are exposed to different amounts of thermal energy. Different thermal budgets may thus be accommodated using radiation absorbing layers formed in the substrate that have different radiation absorption capabilities and, thereby, different heating properties. Accordingly, a subsequently formed higher layer in the apparatus, i.e., a layer farther from the substrate or base layer, can have a higher thermal budget than a previously formed lower layer, i.e., a layer closer to the substrate, and/or a higher thermal budget than the substrate. In conventional anneal processes, a substrate or lower layer with a lower thermal budget would not be feasible, as the substrate and lower annealable layer would be exposed to the same (or nearly the same) amount of energy as the subsequently formed annealable layers.

The term "thermal budget" refers to the total amount of thermal energy that may be transferred to an apparatus or portion thereof, e.g., a specific layer, structure, or other component, during elevated temperature operations or procedures without causing damage or other undesirable results. In some cases, the thermal budget of a specific portion of a apparatus is established during the design process as a maximum permitted thermal energy level for the specific portion. A wide variety of factors or parameters can be considered in establishing the thermal budget for a specific apparatus portion, including, for example, various diffusion-related considerations.

Other characteristics of the radiation directed 106 at the apparatus, such as the intensity, or whether the radiation is continuous or pulsed, can also be varied. Moreover, the disclosed embodiments are well suited for use with non-laser radiation or other non-focused radiation since the disclosed embodiments are configured to achieve localized annealing without having to rely on the precise positioning of a focused laser beam. Instead, localized annealing and other benefits are provided by the radiation absorbing layer(s) of the disclosed embodiments. The radiation can also be incoherent and, therefore, lack spatial coherence, or be non-collimated. Notwithstanding the foregoing, the disclosed embodiments can use laser or other collimated, coherent, or focused radiation in some cases. For example, a rastering laser can be used to cover multiple areas of an apparatus.

The remaining FIGS. 2-15 illustrate different embodiments of methods for fabricating apparatus according to the various teachings, and examples of the apparatus fabricated using these methods, wherein the apparatus includes one or more radiation absorbing layers formed on a substrate to anneal one or more annealable layers or selective areas thereof. The annealing of the one or more annealable layers in accordance with the methods shown by reference to FIGS. 2, 4, 6, 8, 10, and 13 can be directed to various purposes involving the formation of various device structures. Such purposes and/or device structures include, generally and by way of example: establishing dopant profiles using the annealing; doped regions that are electrically activated through the annealing; layers or regions defined or created via the annealing; layers or materials bonded by the annealing; silicidation, using the annealing, to form silicides such as titanium silicides, cobalt silicides, and nickel silicides; local reactions of two or more materials to form a different material using the annealing; solid phase epitaxy using the annealing; or amorphous-Si conversion to crystalline Si or poly-crystalline Si using the annealing. Any of the methods described by reference to FIGS. 1, 2, 4, 6, 8, 10, and 13 can be used alone or in different combinations.

In some applications, the annealing of the annealable layers is used to define, establish, or otherwise support the formation of an upper constituent layer and a lower constituent layer of a particular annealable layer. In one example, the upper and lower constituent layers can be semiconductor regions with different doping levels or different dopants. Alternatively, the upper and lower constituent layers can include different materials, such as a silicide layer disposed on an underlying silicon layer from which the silicide is formed. In another example application, the upper and lower constituent layers are bonded to one another via the annealing. In yet another application, one or both of the constituent layers includes a dielectric material densified or otherwise processed via the annealing.

Moreover, the apparatus of FIGS. 3, 5, 7, 9, 11, 12, 14, and 15 is shown in simplified form. The figures do not show the device structures and all of the metal, passivation, and/or other layers supported by the substrate. For example, the figures do not show a number of the regions of the substrate or annealable layers configured to form one or more transistor or other devices. In addition, the apparatus may have a number of other structures or components for connectivity, isolation, packaging, and other purposes not shown in the figures for ease of illustration. For instance, the apparatus might include an enclosure, encapsulation, lead frame, or other packaging element coupled to the substrate and/or other components of the apparatus, which are not shown in the figures.

Figure 3:
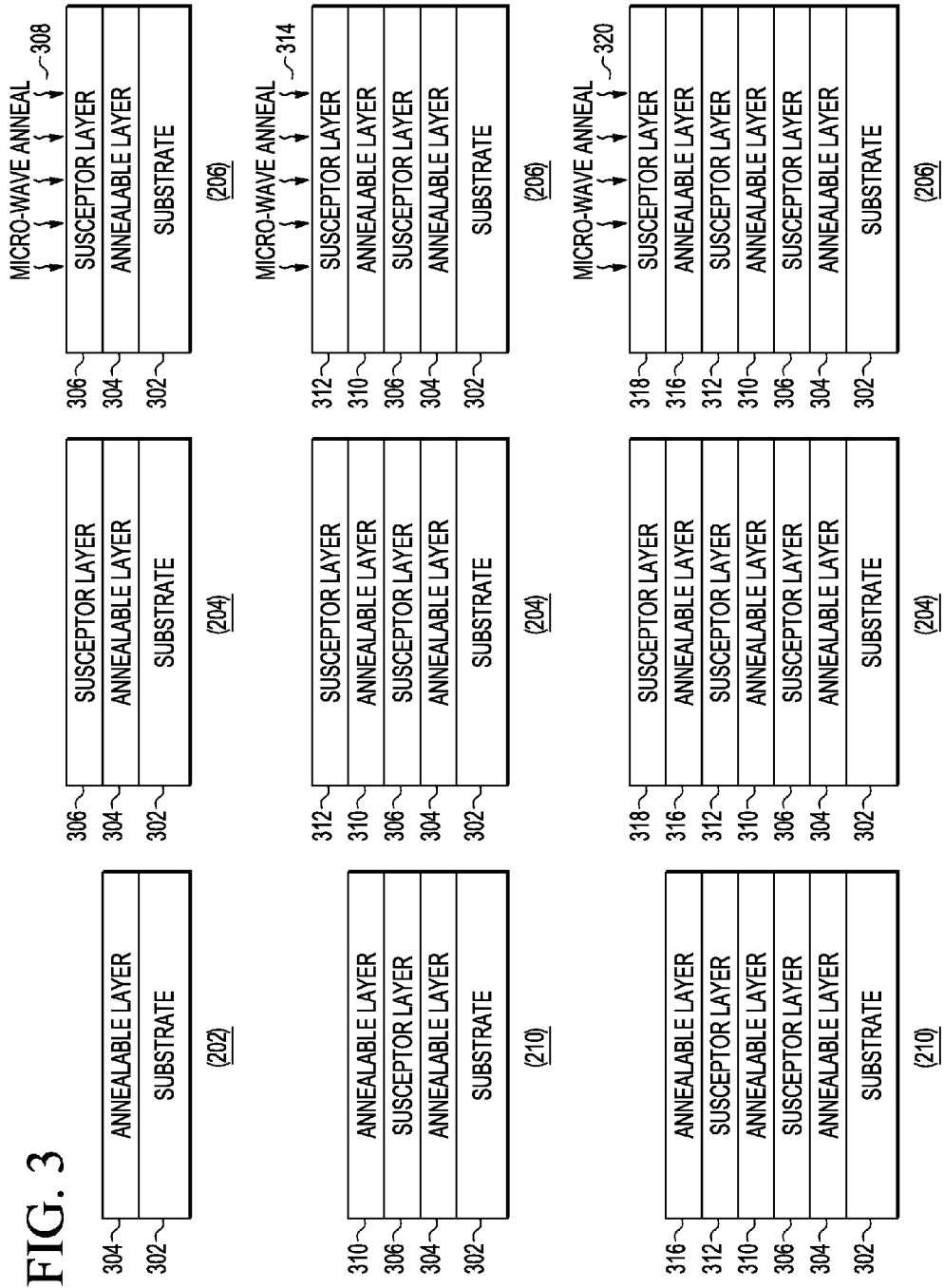
FIG. 3 is a schematic diagram illustrating portions of an apparatus fabricated using the method illustrated in FIG. 2.

Turning next to FIGS. 2 and 3, a method 200 is shown that can be used to fabricate apparatus, such as the apparatus shown in FIG. 3, having formed therein one or more radiation absorbing layers, in accordance with an embodiment of the present teachings. In this embodiment, a radiation absorbing layer is formed on the substrate after an annealable layer is formed on the substrate. In addition, although only cross-sectional cut-aways of the apparatus are shown, the radiation absorbing layer(s) facilitate a blanket annealing over a two-dimensional surface, e.g., a plane, of the annealable layer(s). Thus, the radiation absorbing layer is formed in a different Cartesian coordinate plane than the annealable layer. In other words, the radiation absorbing layer is formed perpendicular to a major surface of the annealable layer. FIGS. 2 and 3 are described concurrently for ease of understanding.

Turning to method 200, an annealable layer 304 is formed on a substrate 302 in an act 202; and in an act 204, a radiation (e.g., microwave) absorbing layer 306 is formed on the annealable layer 304. Radiation is directed 206 toward the apparatus formed by layers 302, 304, and 306 to perform an anneal, e.g., a microwave anneal, process 308 to anneal the annealable layer 304. In one implementation of method 200, a single annealable layer is annealed using a single microwave absorbing layer; but, optionally, the method continues to an act 208 where additional layers can be formed on the substrate. If, at 208, the apparatus requires no additional annealable layers that need annealing, the method ends at 212. However if additional annealable layers needing annealing are to be fabricated, in an act 210 another annealable layer 310 is formed on the microwave absorbing layer 306. The method 200 then returns to the act 204 and forms a second microwave absorbing layer 312 on the annealable layer 310 and to the act 206 to perform another microwave anneal 314. As shown, a third annealable layer 316 and a third microwave absorbing layer 318 are formed in the apparatus followed by a third microwave anneal 320.

In this embodiment, a stacked layer arrangement can be fabricated, wherein a two-dimensional annealable layer is first deposited followed by a two-dimensional radiation absorbing layer. As shown, the annealable layer 304 and the radiation absorbing layer 306 are included in a first pair of layers. However, the method 200 can further facilitate forming at least one (in this case two) additional pair of layers on the substrate 302, wherein each additional pair of layers includes another annealable layer and another radiation absorbing layer. Moreover, in this embodiment, directing 206 the radiation toward the apparatus can include directing the radiation multiple times, e.g., 308, 314, and 320, while the pairs of layers are formed on the substrate 302. Also, in this particular embodiment, directing 206 the radiation multiple times, e.g., 308, 314, and 320, includes directing 206 the radiation after each pair of layers is formed on the substrate. However, in other embodiments, depending on the purpose of the annealing, the radiation type, and/or the properties of the radiation absorbing layers, for instance, fewer anneals are performed than the number of pairs of annealable and radiation absorbing layers.

Figure 4:
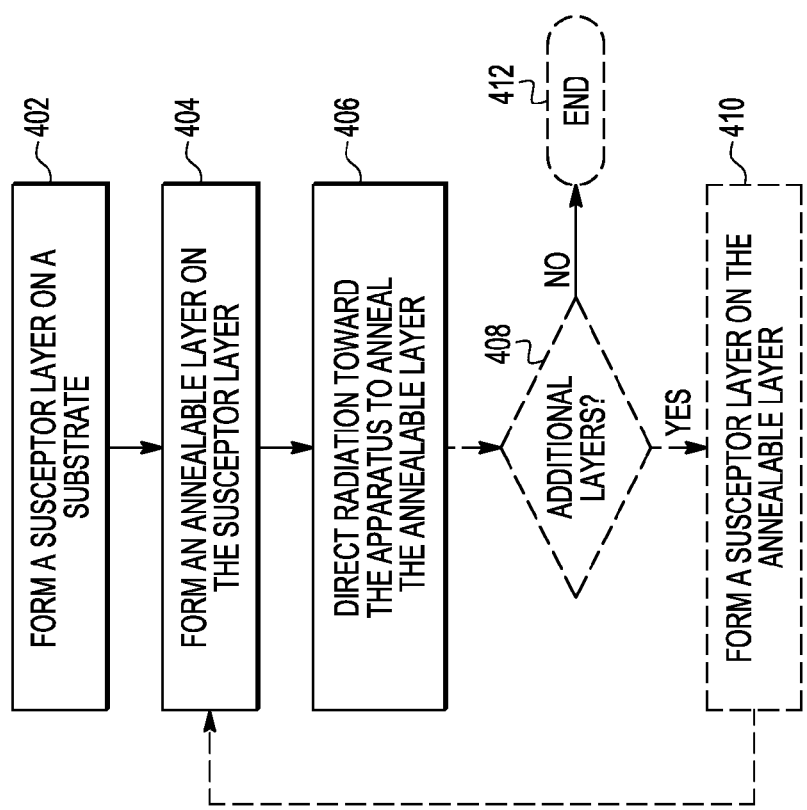
FIG. 4 is a flow diagram illustrating a method for apparatus fabrication using localized annealing by radiation, in accordance with another embodiment.
Figure 5:
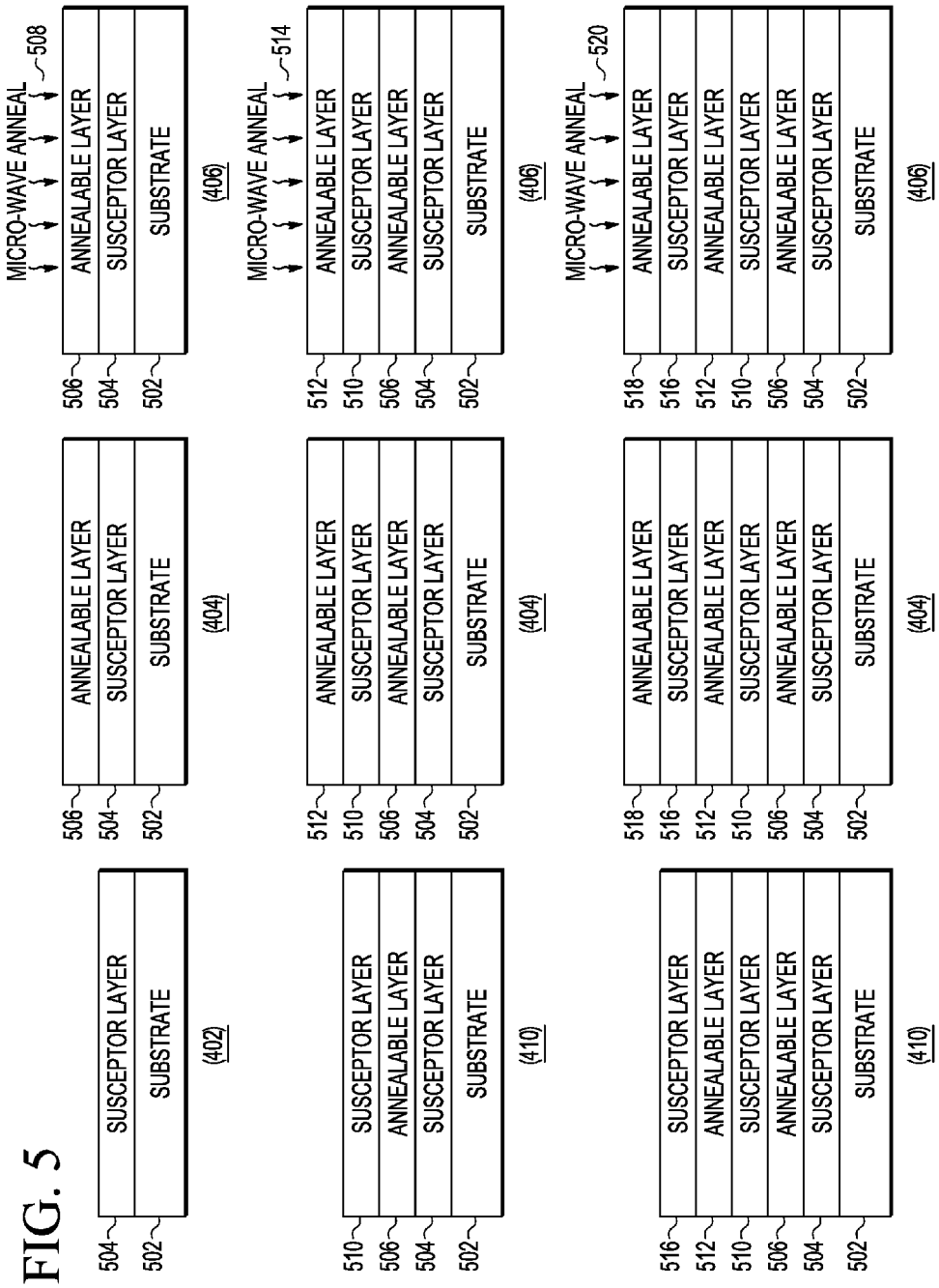
FIG. 5 is a schematic diagram illustrating portions of an apparatus fabricated using the method illustrated in FIG. 4.

In FIGS. 4 and 5, a method 400 is shown that can be used to fabricate apparatus, such as the apparatus shown in FIG. 5, having formed therein one or more radiation absorbing layers, in accordance with an embodiment of the present teachings. In this embodiment, a radiation absorbing layer is formed on the substrate before the annealable layer is formed on the substrate. In addition, although only cross-sectional cut-aways of the apparatus are shown, the radiation absorbing layer(s) facilitate a blanket annealing over a two-dimensional surface, e.g., a plane, of the annealable layer(s). Thus, the radiation absorbing layer is formed in a different Cartesian coordinate plane than the annealable layer. FIGS. 4 and 5 are described concurrently for ease of understanding.

Turning to method 400, a radiation (e.g., microwave) absorbing layer 504 is formed on a substrate 502 in an act 402; and in an act 404, an annealable layer 506 is formed on the radiation absorbing layer 504. Radiation is directed 406 toward the apparatus formed by layers 502, 504, and 506 to perform an anneal, e.g., a microwave anneal, process 508 to anneal the annealable layer 506. In one implementation of method 400, a single annealable layer is annealed using a single microwave absorbing layer; but, optionally, the method continues to an act 408 where additional layers can be formed on the substrate. If, at 408, the apparatus requires no additional annealable layers that need annealing, the method ends at 412. However if additional annealable layers needing annealing are to be fabricated, in an act 410 another microwave absorbing layer 510 is formed on the annealable layer 506, and the method 400 then returns to the act 404 and forms a second annealable layer 512 on the microwave absorbing layer 510 and to the act 406 to perform another microwave anneal 514. As shown, a third microwave absorbing layer 516 and a third annealable layer 518 are formed in the apparatus followed by a third microwave anneal 520.

In this embodiment, a stacked layer arrangement can be fabricated, wherein a two-dimensional radiation absorbing layer is first deposited followed by a two-dimensional annealable layer. As shown, the annealable layer 506 and the radiation absorbing layer 504 are included in a first pair of layers. However, the method 400 can further facilitate forming at least one (in this case two) additional pair of layers on the substrate 502, wherein each additional pair of layers includes another annealable layer and another radiation absorbing layer. Moreover, in this embodiment, directing 506 the radiation toward the apparatus can include directing the radiation multiple times, e.g., 508, 514, and 520, while the pairs of layers are formed on the substrate 502. Also, in this particular embodiment, directing 506 the radiation multiple times, e.g., 508, 514, and 520, includes directing 506 the radiation after each pair of layers is formed on the substrate. However, in other embodiments, depending on the purpose of the annealing, the radiation type, and/or the properties of the radiation absorbing layers, for instance, fewer anneals are performed than the number of pairs of annealable and radiation absorbing layers.

Figure 6:
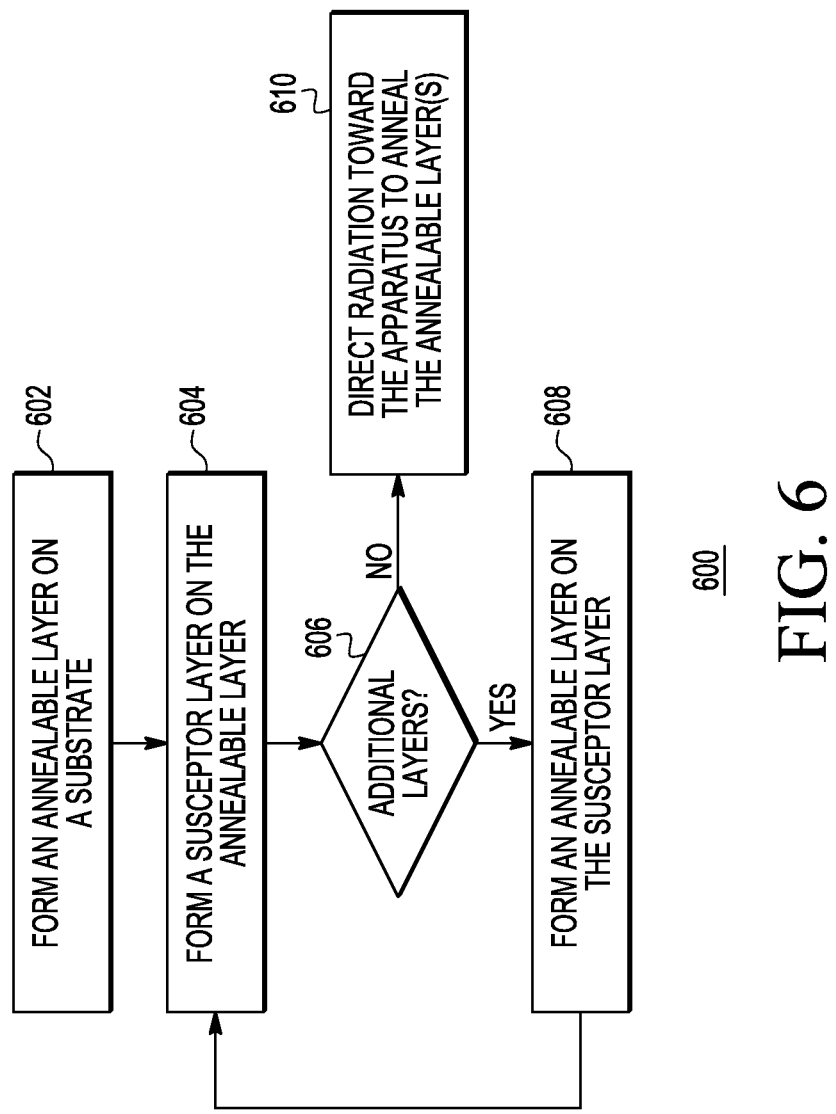
FIG. 6 is a flow diagram illustrating a method for apparatus fabrication using localized annealing by radiation, in accordance with another embodiment.
Figure 7:
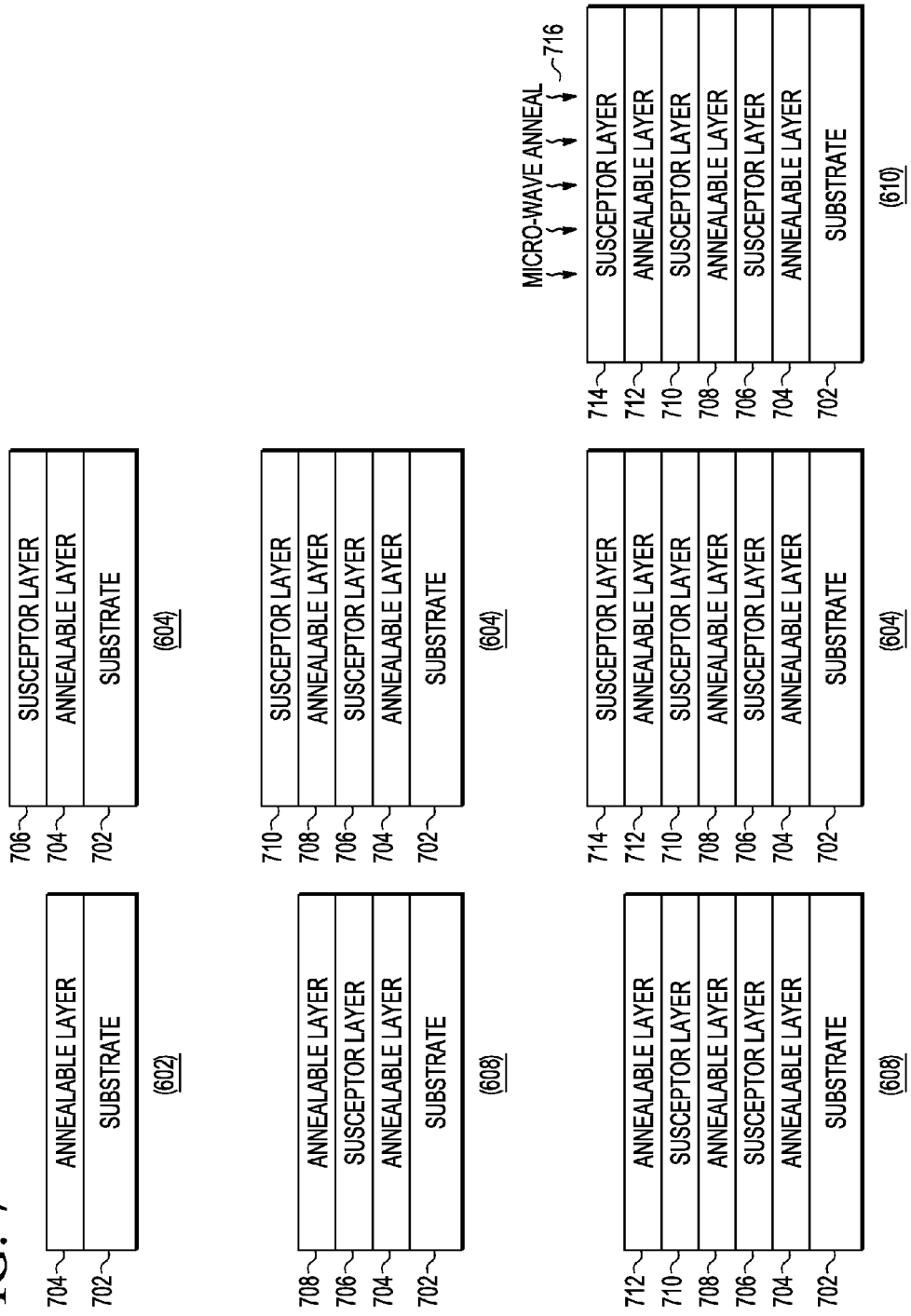
FIG. 7 is a schematic diagram illustrating portions of an apparatus fabricated using the method illustrated in FIG. 6.

FIGS. 6 and 7 illustrate an embodiment that is similar to the embodiment shown in and described by reference to FIGS. 2 and 3, except that radiation is directed only once toward the apparatus after all the pairs of layers are formed on the substrate instead of performing multiple anneals during the process of fabricating the apparatus. Accordingly, the embodiment illustrated by reference to FIGS. 6 and 7 also demonstrates radiation absorbing layers formed in different Cartesian coordinate planes from the annealable layers that they assist in annealing. FIGS. 6 and 7 also demonstrate a blanket anneal of one of more annealable layers, wherein the radiation absorbing layer is formed on the substrate after the annealable layer. The embodiment using a single anneal for multiple layers is useful, for instance, when the layers are thin enough that a single radiation heating is sufficient to anneal all of the structures in the annealable layers. In one example implementation, the annealable layers and the radiation absorbing layers can be in the range of 50 A to 2 microns in thickness, with the thickness of the layers at the top of the structure being selected such that not all of the radiation is absorbed by these top layers. This would enable part of the radiation to penetrate down to, and therefore be absorbed by, the lower layers.

Turning to method 600, a first annealable layer 704 followed by a first radiation, in this case microwave, absorbing layer 706 are formed on a substrate 702 in acts 602 and 604, respectively. If it is determined, at 606, that additional layers are to be formed in the apparatus, the next annealable layer is formed on the immediately preceding microwave absorbing layer, in an act 608; and, at 604, the next microwave absorbing layer is formed on the immediately preceding annealable layer. Once determined, at 606, that the final layer was formed in the apparatus, radiation is directed once at all the layers in the apparatus, in an act 610, to anneal the annealable layers. As shown in FIG. 7, two additional pairs of annealable layers followed by microwave absorbing layers, e.g., pairs 708 and 710, and 712 and 714, are formed on the substrate 702, during acts 608 and 604, respectively. A single microwave anneal process 716 is then applied to all the layers at one time, during the act 610, to anneal the annealable layers 704, 708, and 712.

Figure 8:
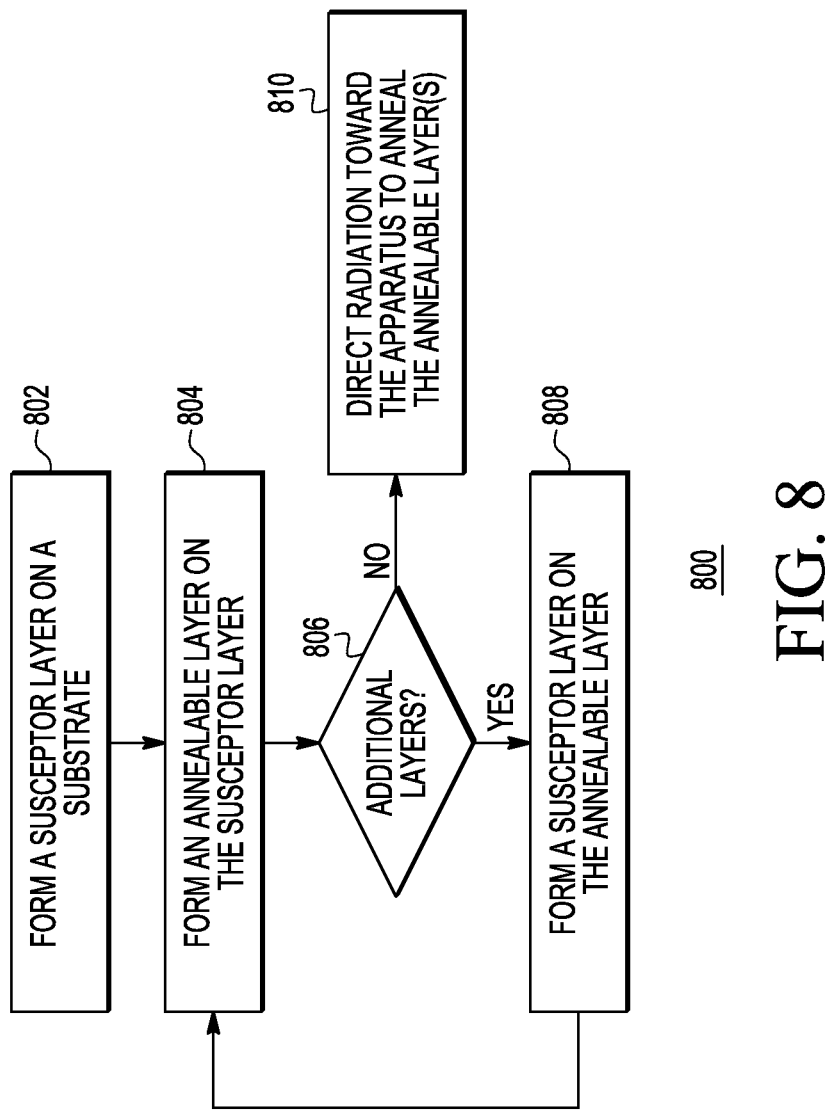
FIG. 8 is a flow diagram illustrating a method for apparatus fabrication using localized annealing by radiation, in accordance with another embodiment.
Figure 9:
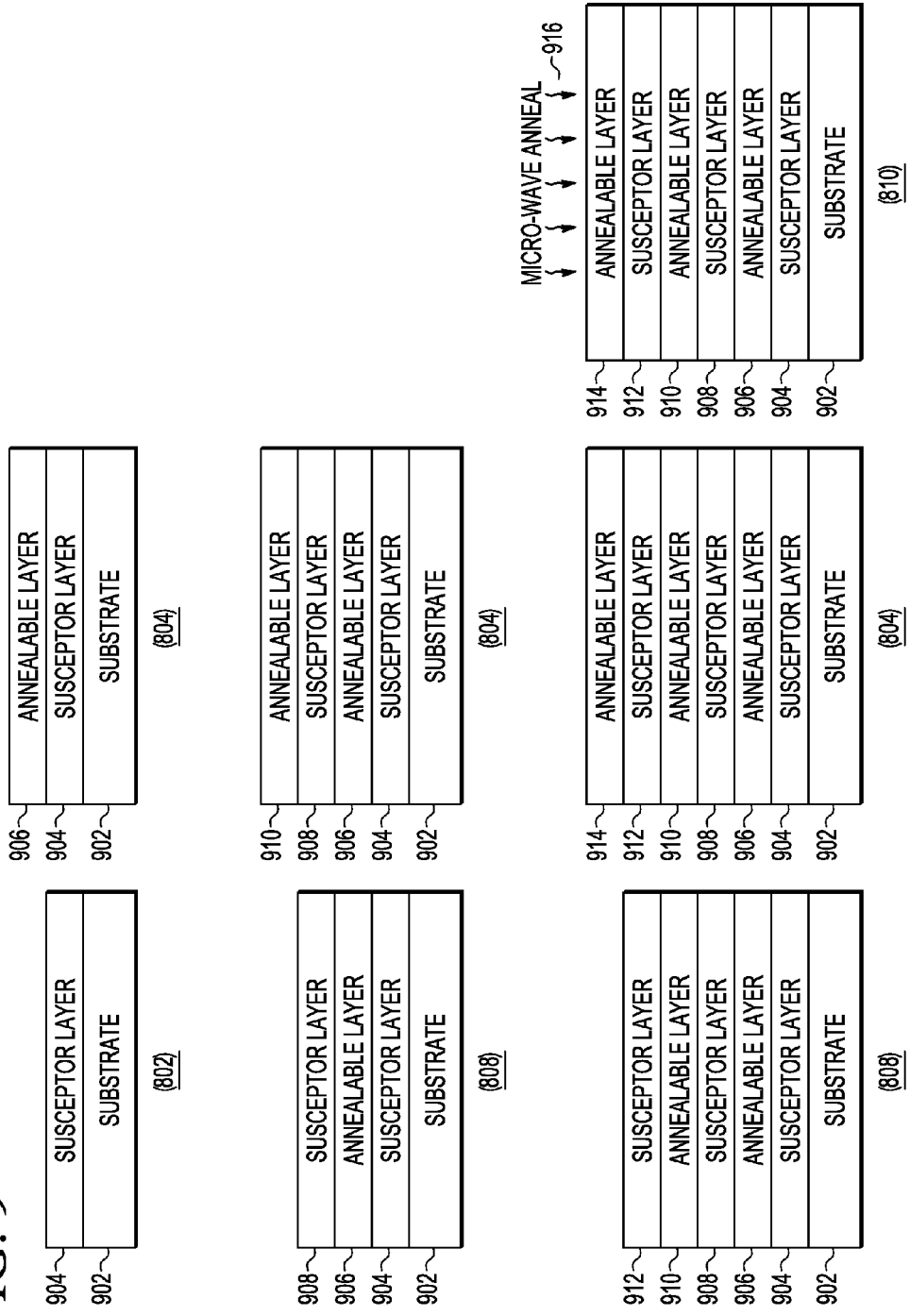
FIG. 9 is a schematic diagram illustrating portions of an apparatus fabricated using the method illustrated in FIG. 8.

FIGS. 8 and 9 illustrate an embodiment that is similar to the embodiment shown in and described by reference to FIGS. 4 and 5, except that radiation is directed only once toward the apparatus after all the pairs of layers are formed on the substrate instead of performing multiple anneals during the process of fabricating the apparatus. Accordingly, the embodiment illustrated by reference to FIGS. 8 and 9 also demonstrates radiation absorbing layers formed in different Cartesian coordinate planes from the annealable layers that they assist in annealing. FIGS. 8 and 9 also demonstrate a blanket anneal of one of more annealable layers, wherein the radiation absorbing layer is formed on the substrate before the annealable layer.

Turning to method 800, a first radiation, in this case microwave, absorbing layer 904 followed by a first annealable layer 906 are formed on a substrate 902 in acts 802 and 804, respectively. If it is determined, at 806, that additional layers are to be formed in the apparatus, the next microwave absorbing layer is formed on the immediately preceding annealable layer, in an act 808; and, at 804, the next annealable layer is formed on the immediately preceding microwave absorbing layer. Once determined, at 806, that the final layer was formed in the apparatus, radiation is directed once at all the layers in the apparatus, in an act 810, to anneal the annealable layers. As shown in FIG. 9, two additional pairs of microwave absorbing layers followed by annealable layers, e.g., pairs 908 and 910, and 912 and 914, are formed on the substrate 902, during acts 808 and 804, respectively. A single microwave anneal process 916 is then applied to all the layers at one time, during the act 810, to anneal the annealable layers 906, 910, and 914.

Figure 10:
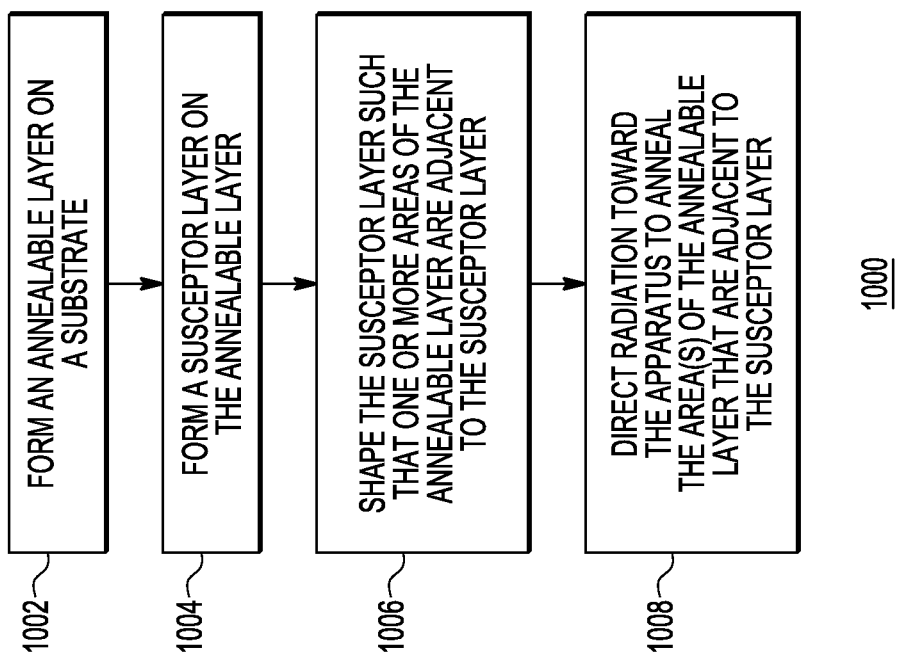
FIG. 10 is a flow diagram illustrating a method for apparatus fabrication using localized annealing by radiation, in accordance with another embodiment.
Figure 11:
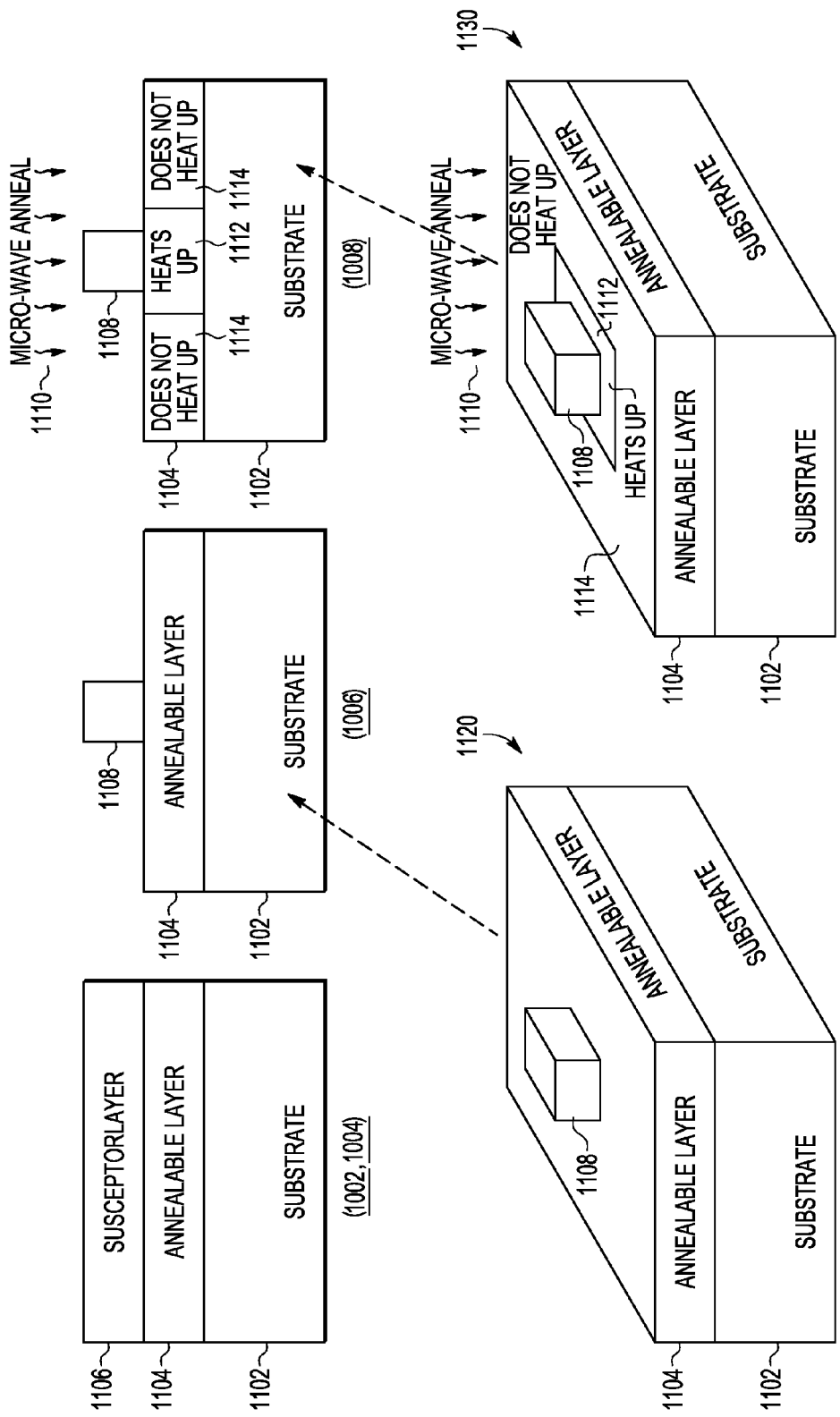
FIG. 11 is a schematic diagram illustrating portions of an apparatus fabricated using the method illustrated in FIG. 10.
Figure 12:
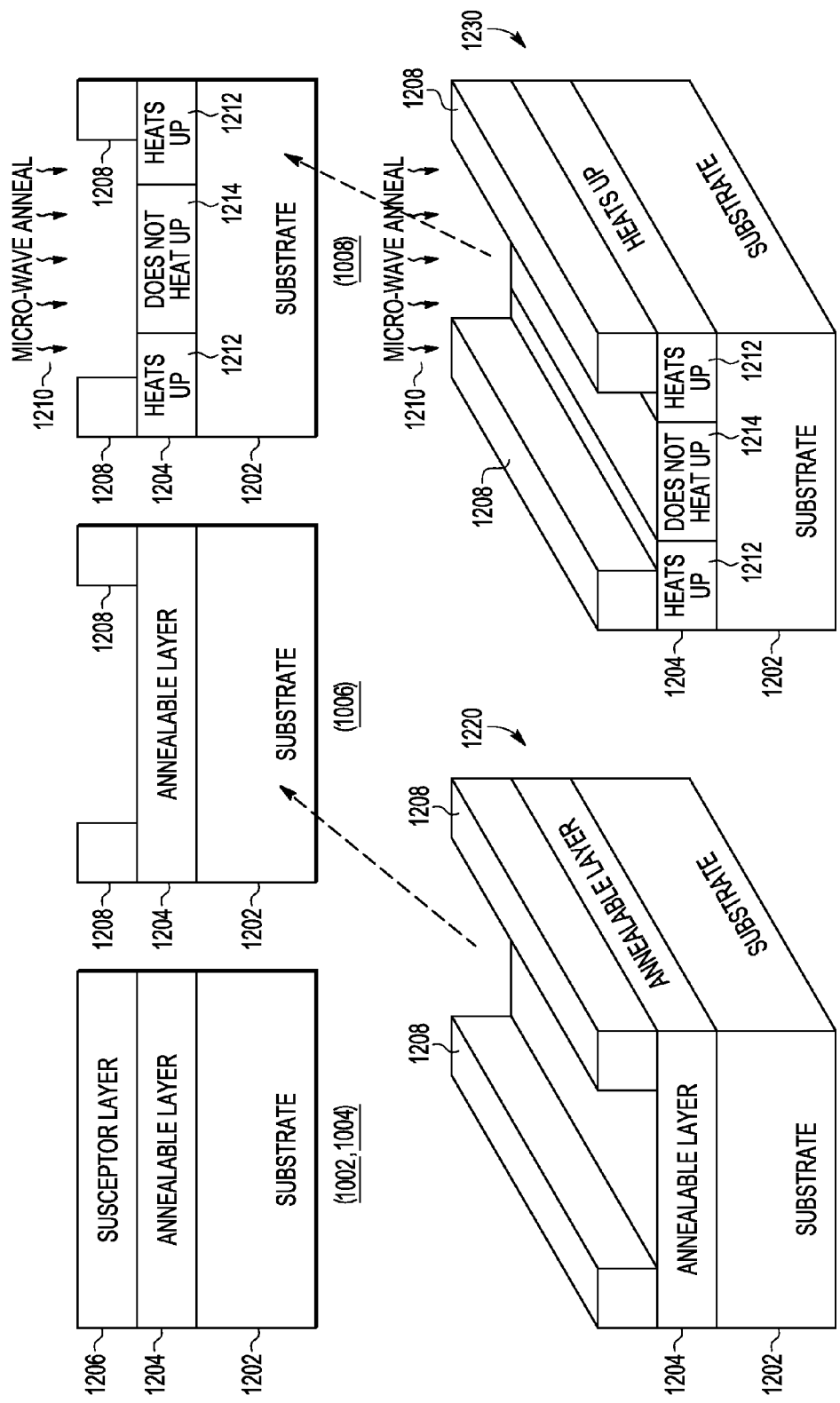
FIG. 12 is a schematic diagram illustrating portions of an apparatus fabricated using the method illustrated in FIG. 10.

FIGS. 10-15 illustrate embodiments where one of both of an annealable layer or a radiation absorbing layer is shaped to anneal only a particular area of the annealable layer, for instance as defined by the shape of the radiation absorbing layer. FIGS. 10-12 particularly illustrate embodiments of shaping just the radiation absorbing layer into both a dot configuration and a line configuration, to anneal sections of an annealable layer defined by those configurations. Turning to method 1000 illustrated in FIG. 10, in acts 1002 and 1004, respectively, an annealable layer is formed on a substrate and a radiation, in this case microwave, absorbing layer is formed on the annealable layer. FIG. 11 shows, in a cross-sectional view, forming an annealable layer 1104 on a substrate 1102 and forming a microwave absorbing layer 1106 on the annealable layer 1104 during the acts 1002 and 1004, respectively. FIG. 12 shows, in a cross-sectional view, forming an annealable layer 1204 on a substrate 1202 and forming a microwave absorbing layer 1206 on the annealable layer 1204 during the acts 1002 and 1004, respectively.

Method 1000 further includes shaping the radiation absorbing layer, in an act 1006, such that one or more areas or segments of the annealable layer are adjacent to the radiation absorbing layer, and the remaining segments or portions of the annealable layer are non-adjacent to the radiation absorbing layer. In an act 1008, radiation is directed toward the apparatus to anneal the one or more portion(s) of the annealable layer that are adjacent to the radiation absorbing layer without annealing the remaining portion of the annealable layer that is non-adjacent to the radiation absorbing layer.

FIG. 11 illustrates the microwave absorbing layer 1106 shaped during the act 1006 into a zero-dimensional shape 1108, which is shown in a cross-sectional view and a perspective view 1120. Further shown, in a cross-sectional view and a perspective view 1130, is a microwave anneal 1110 being applied to the apparatus to anneal a segment 1112 of the annealable layer 1104 that is adjacent to the shaped microwave absorbing layer 1108, without annealing a segment 1114 of the annealable layer 1104 that is not adjacent to the shaped microwave absorbing layer 1108. As can be seen in the embodiment illustrated in FIG. 11, the shape of the annealed segment 1112 of the annealable layer 1104 substantially conforms to, is defined by, and/or otherwise corresponds to the shape of the shaped microwave absorbing layer 1108.

FIG. 12 illustrates the microwave absorbing layer 1206 shaped during the act 1006 into two one-dimensional shapes 1208, which are shown in a cross-sectional view and a perspective view 1220. Further shown, in a cross-sectional view and a perspective view 1230, is a microwave anneal 1210 being applied to the apparatus to anneal segments 1212 of the annealable layer 1204 that are adjacent to the shaped microwave absorbing layer 1208, without annealing a segment 1214 of the annealable layer 1204 that is not adjacent to the shaped microwave absorbing layer 1208. As can be seen in the embodiment illustrated in FIG. 12, the shape of the annealed segments 1212 of the annealable layer 1204 substantially conform to, is defined by, and/or otherwise correspond to the shape of the shaped microwave absorbing layer 1208.

In the embodiments illustrated by reference to FIGS. 10-12 multiple configurations of susceptor material and different numbers of the resulting shaped susceptor material can be formed in one or more layers of the apparatus. Moreover, although only one pair of annealable and radiation absorbing layers is shown and described for brevity, additional pairs of layers or additional annealable layers can be formed in accordance with method 1000 or any of the other methods described herein in accordance with the present teachings. Furthermore, a single or multiple anneals can be performed during the fabrication process 1000, or the order of forming the annealable and radiation absorbing layers can be reversed.

Figure 13:
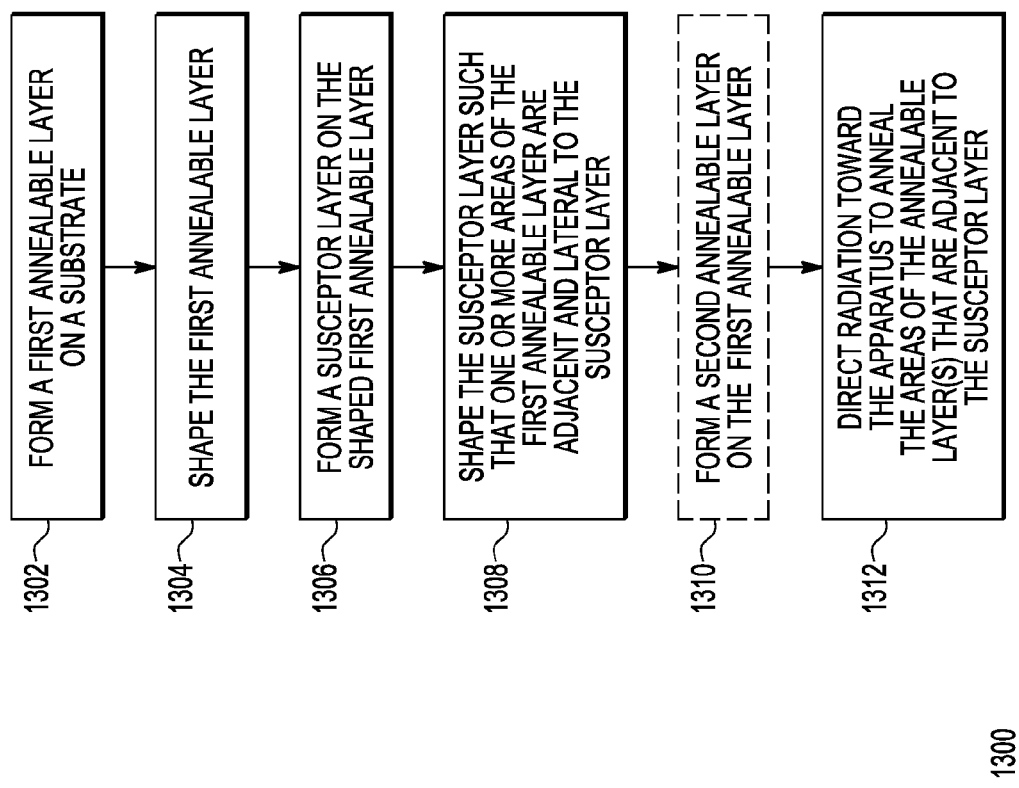
FIG. 13 is a flow diagram illustrating a method for apparatus fabrication using localized annealing by radiation, in accordance with another embodiment.
Figure 14:
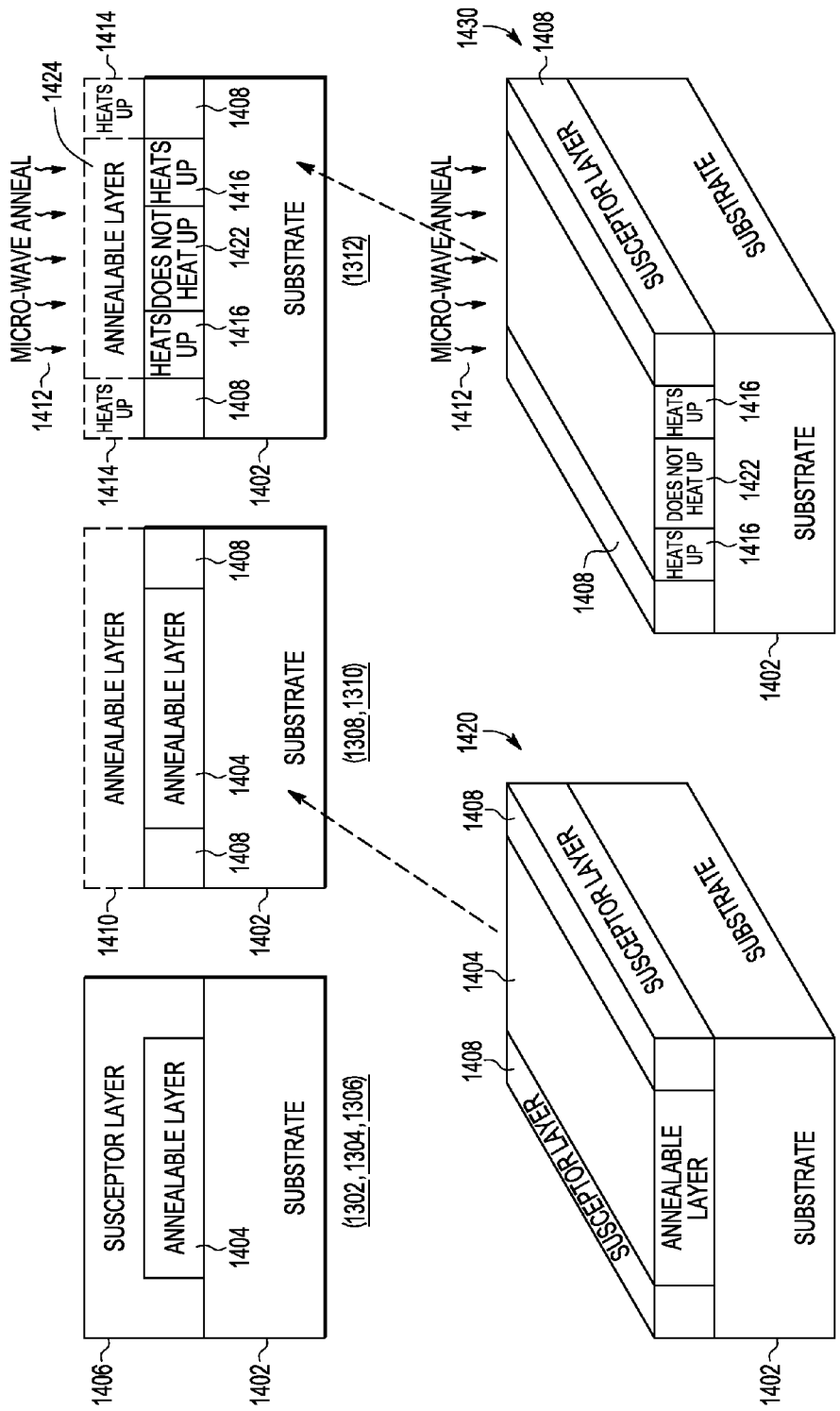
FIG. 14 is a schematic diagram illustrating portions of an apparatus fabricated using the method illustrated in FIG. 13.
Figure 15:
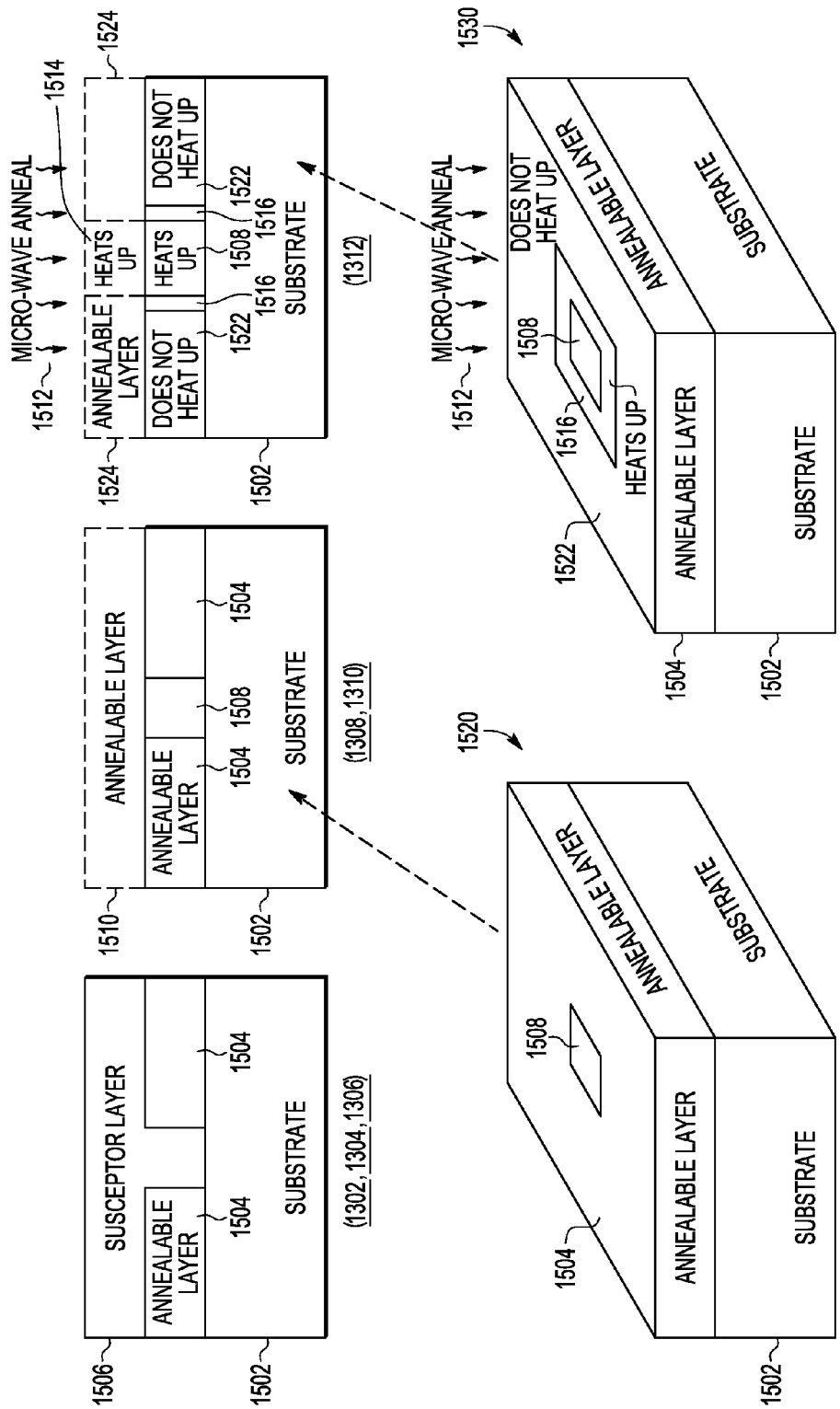
FIG. 15 is a schematic diagram illustrating portions of an apparatus fabricated using the method illustrated in FIG. 13.

FIGS. 13-15 also illustrate embodiments of shaping the radiation absorbing layer into both a dot configuration and a line configuration, to anneal sections of an annealable layer defined by those configurations. FIGS. 13-15, however, further illustrate shaping an annealable layer to facilitate annealing at least a portion of the shaped annealable layer and optionally a portion of at least one other annealable layer. Accordingly, these embodiments show a radiation absorbing layer formed in a same Cartesian coordinate plane as an annealable layer and show radiation absorbing material that is at least partially enclosed by the portion of the annealable layer adjacent to the radiation absorbing material. In other words, the radiation absorbing layer is formed parallel to a major surface of the annealable layer.

Turning to method 1300 illustrated in FIG. 13, in an act 1302, an annealable layer is formed on a substrate. The annealable layer is shaped, in an act 1304, prior to forming a radiation absorbing layer on the substrate. The radiation absorbing layer is then formed, at 1306, on the shaped annealable layer and is shaped, at 1308, to position the radiation absorbing layer adjacent to a first portion of the shaped annealable layer and non-adjacent to a second portion of the shaped annealable layer. Optionally, in an act 1310, method 1300 includes forming a second annealable layer on the substrate after the first annealable layer and the radiation absorbing layer are formed on the substrate. In such a case, the radiation absorbing layer has a higher radiation absorption capability than both the first and the second annealable layers. In addition, as positioned, a first portion of the second annealable layer is adjacent to the radiation absorbing layer and a second portion of the second annealable layer is non-adjacent to the radiation absorbing layer. In an act 1312, radiation is directed at the layers of the apparatus such that the portion(s) of the first, and if applicable second, annealable layer(s) that are adjacent to the shaped radiation absorbing layer are annealed using the radiation without annealing the portion(s) of the annealable layer(s) that are non-adjacent to the shaped radiation absorbing layer.

FIG. 14 illustrates, in a cross-sectional view, performing acts 1302, 1304, and 1306, respectively, of: forming an annealable layer on a substrate 1402; shaping 1404 the annealable layer; and forming a radiation, in this case microwave, absorbing layer 1406 on the shaped annealable layer 1404. Further illustrated in a cross-sectional view and a perspective view 1420 is the act 1308 of shaping the microwave absorbing layer 1406 into two one-dimensional shapes 1408. As a result of shaping both the annealable and microwave absorbing layers, the annealable layer segment 1404 and the remaining microwave absorbing layer portions 1408 are positioned in a same Cartesian coordinate plane relative to the substrate 1402, which is positioned in a lower plane. The microwave absorbing layer portions 1408 are also, in this embodiment, positioned laterally and in this case at opposite sides of the shaped annealable layer 1404 within the same plane, as best shown in the perspective view 1420. Further shown, in a cross-sectional view and a perspective view 1430, is a microwave anneal 1412 being applied during the act 1312 to the apparatus to anneal segments 1416 of the shaped annealable layer 1404 that are adjacent to the shaped microwave absorbing layer 1408, without annealing a segment 1422 of the annealable layer 1404 that is not adjacent to the shaped microwave absorbing layer 1408.

As explained above, method 1300 accommodates at least one other annealable layer 1410 formed on the substrate 1402, in the act 1310, as a higher layer in the stacked apparatus. This annealable layer effectively embeds the microwave absorbing segments 1408 within the apparatus. In this particular embodiment, the annealable layer 1410 is not shaped. However, depending on the structures being fabricated on the apparatus, this additional annealable layer might be shaped. Moreover, one or more other annealable layers and/or microwave absorbing layers, which may or may not be shaped, can be formed on the substrate 1402. The anneal procedure 1412 is further used to anneal segments 1414 of the annealable layer 1410 that are adjacent to the shaped microwave absorbing layer 1408, without annealing a segment 1424 of the annealable layer 1410 that is not adjacent to the shaped microwave absorbing layer 1408. As can be seen in the embodiment illustrated in FIG. 14, the shape of the annealed segments 1414 and 1416 of the annealable layers 1410 and 1404, respectively, substantially conform to, are defined by, and/or correspond to the shape of the shaped microwave absorbing layer 1408.

FIG. 15 illustrates, in a cross-sectional view, performing acts 1302, 1304, and 1306, respectively, of: forming an annealable layer on a substrate 1502; shaping 1504 the annealable layer; and forming a radiation, in this case microwave, absorbing layer 1506 on the shaped annealable layer 1504. Further illustrated in a cross-sectional view and a perspective view 1520 is the act 1308 of shaping the microwave absorbing layer 1506 into a zero-dimensional shape 1508. As a result of shaping both the annealable and microwave absorbing layers, the annealable layer segment 1504 and the remaining microwave absorbing layer portion 1508 are positioned in a same Cartesian coordinate plane relative to the substrate 1502, which is positioned in a lower plane. The microwave absorbing layer portion 1508 is also, in this embodiment, positioned such that it is surrounded by the shaped annealable layer 1504 within the same plane, as best shown in the perspective view 1520. Further shown, in a cross-sectional view and a perspective view 1530, is a microwave anneal 1512 being applied during the act 1312 to the apparatus to anneal a segment 1516 of the shaped annealable layer 1504 that is adjacent to the shaped microwave absorbing layer 1508, without annealing a segment 1522 of the annealable layer 1504 that is not adjacent to the shaped microwave absorbing layer 1508.

As explained above, method 1300 accommodates at least one other annealable layer 1510 formed on the substrate 1502, in the act 1310, as a higher layer in the stacked apparatus. This annealable layer effectively embeds the microwave absorbing segment 1508 within the apparatus. In this particular embodiment, the annealable layer 1510 is not shaped. However, depending on the structures being fabricated on the apparatus, this additional annealable layer might be shaped. Moreover, one or more other annealable layers and/or microwave absorbing layers, which may or may not be shaped, can be formed on the substrate 1502. The anneal procedure 1512 is further used to anneal a segment 1514 of the annealable layer 1510 that is adjacent to the shaped microwave absorbing layer 1508, without annealing a segment 1524 of the annealable layer 1510 that is not adjacent to the shaped microwave absorbing layer 1508. As can also be seen in the embodiment illustrated in FIG. 15, the shape of the annealed segments 1514 and 1516 of the annealable layers 1510 and 1504, respectively, substantially conform to, are defined by, and/or correspond to the shape of the shaped microwave absorbing layer 1508.

In the embodiments illustrated by reference to FIGS. 13-15 multiple configurations of susceptor material and different numbers of the resulting shaped susceptor material can be formed in one or more layers of the apparatus. Moreover, although only one pair of annealable and radiation absorbing layers is shown and described for brevity, additional pairs of layers or additional annealable layers can be formed in accordance with method 1300 or any of the other methods described herein in accordance with the present teachings. Furthermore, a single or multiple anneals can be performed during the fabrication process 1300, or the order of forming the annealable and radiation absorbing layers can be reversed.

In general, the method described herein in accordance with the present teachings can be used to fabricate an apparatus that includes: a structure having an annealed section and a non-annealed section; and susceptor material that is integral to the apparatus and positioned adjacent to the annealed section such that the annealed and non-annealed sections are defined by a shape of the susceptor material, wherein the annealed section was formed from material that was annealed at a temperature at least partially due to heat from the susceptor material's exposure to radiation. In an embodiment, the susceptor material is configured to absorb radiation to a greater degree than the material of the annealed section. In one example implementation, the susceptor material includes a first susceptor layer that is configured with a first dielectric loss factor that generates a first absorption capability, which corresponds to a frequency of a first radiation used to generate the annealed section. In a further example implementation, the susceptor material includes a second susceptor layer that is configured with a second dielectric loss factor that generates a second absorption capability, which corresponds to a frequency of a second radiation used to generate the annealed section. In some particular embodiments, the annealed section includes at least one of: a semiconductor material having an electrically activated dopant; an annealed silicide layer; a first constituent layer bonded to a second constituent layer; or an annealed organic material.

The apparatus segments illustrated in FIGS. 3, 5, 7, 9, 11, 12, 14, and 15 can represent any number of stages of the fabrication process and/or applications during the fabrication including, for example, doping, layering, patterning, heat treatments, and device fabrication. Regarding device fabrication, the apparatus segments illustrated in FIGS. 3, 5, 7, 9, 11, 12, 14, and 15 can represent a number of devices, examples of which are provided above, where the layer(s) containing the device or devices are annealed, and the substrate supporting the device(s) is not. More particularly with respect to doping, the apparatus segments illustrated in FIGS. 3, 5, 7, 9, 11, 12, 14, and 15 can represent thermal diffusion to drive dopants deeper into a layer or substrate to achieve a desired doping profile for specific devices such as diodes, transistors or other devices.

The apparatus segments illustrated in FIGS. 3, 5, 7, 9, 11, 12, 14, and 15 can also represent ion implantation or electrical activation as relates to doping. Ion implantation can include, for instance: an ion-implanted Si layer that needs to be recrystallized and electrically activated; an arsenic, boron, phosphorus, antimony, or BF2 implanted Si layer that needs to be recrystallized and/or electrically activated, or for implantation of SiGe, SiGeC layers; an ion implantation for III-V compound, e.g., GaAs, AlGaAs, AlAs, InAs, InGaAs, InGaP, InP, other III-V compound, device fabrication, including Si ion implantation to create high quality channels, O and H ion implantation to produce device isolation, and MeV Si and O ion implantation to form internal links, wherein the annealing is needed to electrically activate dopants and to heal crystal defects from the implants; ion implantation for GaN, AlGaN, and InGaN device fabrication, including Si, Mg, C ion implantation for doping and Ti, O, Fe, Cr implantation for high-resistivity GaN; ion implantation for II-VI compound devices, e.g., ZnSe, ZnS, CdTe, HgCgTe, CdS, with Co, B or other implants; or ion implantation for oxide-based dielectrics and semiconductor device applications such as ZnO, Tin-oxide, Indium-Tin-oxide, etc., and, N, O, Fe, Zn, Y, Ag, Co, H, Ga implanted ZnO.

Electrical activation can include, for instance: dopants that are incorporated by a non-ion-implanted means, such as diffusion from a source layer, or incorporated as an as-deposited layer but not yet electrically activated; a previously incorporated dopant that was de-activated by another process and needing re-activation; arsenic, boron, phosphorus, antimony, or gallium doped Si that needs to be electrically activated; doping and activation for III-V or II-VI or GaN-based or oxide-based devices; doping and activation for organic conductors or semiconductors; or doping for oxide-based dielectrics and semiconductor device applications such as ZnO, Tin-oxide, Indium-Tin-oxide etc., e.g., N, O, Fe, Zn, Y, Ag, Co, H, Ga doped ZnO.

More particularly with respect to heat treatments, the apparatus segments illustrated in FIGS. 3, 5, 7, 9, 11, 12, 14, and 15 can represent locally enhanced heat treatment, for applications including, but not limited to: conversion of amorphous-material such as a-Si to a nano-crystalline material such as nc-Si; conversion of amorphous-material such as a-Si to a poly-crystalline material such as poly-Si; conversion of amorphous-material such as a-Si to a single-crystalline material such as lateral-epitaxial Si; vertical solid-phase epitaxy; grain growth to, for instance, increase the grain size of a metal layer such as Al or Au or increase the grain-size of poly-Si; annealing out defects such as vacancies, interstitials, dislocations, or stacking faults; electrical activation of dopants; driving in dopant atoms to create a desired dopant-profile, for instance to tailor electrical properties of a device; reaction of two layers to form a compound, for instance as in silicidation; or densification of layers, for instance densification of deposited low-density oxides or nitrides. More particularly with respect to layering, the apparatus segments illustrated in FIGS. 3, 5, 7, 9, 11, 12, 14, and 15 can represent, for example: silicidation where a Ti, Co, W, Pt, or Ni layer on top of Si needs to be reacted with the Si to form a silicide conducting layer; reaction layers, which result from a reaction between two or more layers such as occurs, for instance, in silicidation or a reaction of a metal with GaAs, InP, or GaN for contacts or metal-semiconductor field-effect-transistor applications; or crystallization, such as Amorphous-Si conversion to crystalline Si based on epitaxy with underlying single-crystal Si, or laterally present single-crystal Si.

Some applications, such as those that follow, are more suited for implementation using the disclosed methods that can fabricate apparatus (segments of which are shown in FIGS. 5, 9, 14, and 15) having a microwave absorbing layer or portion thereof fabricated directly on the substrate and that is, in at least some embodiments, buried under one or more other annealable or microwave absorbing layers. Such applications include, for example, layering applications such as: bonding of two different materials, for instance carbon-nanotube to Si or GaAs, p-type Si to n-type Si, highly doped Si to low-doped Si, metal underlayer to Si overlayer, GaAs to Si, GaN to Si, or Si to SiO2; oxidation and nitridation that would use a oxygen- or nitrogen-permeable microwave absorbing material (MAM) for MAM overlayer or buried MAM layer; deposition using a buried MAM layer; or deposition of overlayer films by chemical vapor deposition CVD, atmospheric pressure CVD, high-pressure CVD, low-pressure CVD, photochemical UV low-pressure CVD, plasma-enhanced CVD, CVD of SiO2, Si3N4, epitaxial-Si, poly-Si, and metals such as Al, Al—Si, Al—Cu, Ni, Cr, Au, W, Ti, Mo, Pt, Pd, Co, Ni, and related silicides. The segments of apparatus shown in FIGS. 5, 9, 14, and 15 also represent patterning including, for example: locally enhanced patterning involving the selective removal of top layers of a material where the removal is enhanced by local heat or microwaves; or etching such as wet etch, dry etch, lift-off, ion-milling, or reactive-ion-etching.

Additionally, the fabrication methods described herein can be applied over a variety of temperatures including during low temperature annealing processes. What is considered a "low temperature" anneal depends at least in part on the specific process application. For example for semiconductor processing: a low temperature anneal might be in the range of 50 degrees Celsius (C) to 450 C; an intermediate temperature anneal from 450 C to 800 C; and a high temperature anneal from 800 C to 1200 C. Whereas, for organic device processing, a low temperature anneal might include temperatures of up to 150 C to 200 C.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to semiconductor and organic device fabrication including those using conventional CMOS technology, CMOS devices, MOSFETs, and other functional aspects of a system, structure, or IC, and the individual system, structure, or IC operating components, may not be described in detail. Moreover, the various IC embodiments described above may be produced or fabricated using at least some elements of conventional semiconductor processing techniques, e.g., well known CMOS techniques. Further, a variety of well-known and common semiconductor materials may be used, e.g., traditional metals such as aluminum, copper, gold, etc., polysilicon, silicon dioxide, silicon nitride, silicon, and the like.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of" and any like or similar terms means that referenced elements have an physical arrangement in an inactive state. This physical arrangement while in the inactive state enables the elements to perform stated functionality while in the active state. A device, apparatus, or structure that is "configured" in a certain way is configured in at least that way, but may also be configured in ways that are not described.

The above description refers to features being "connected" or "coupled" together. As used here and, unless expressly stated otherwise, "coupled" means that one feature is directly or indirectly joined to or is in direct or indirect communication with another feature, and not necessarily physically. As used herein, unless expressly stated otherwise, "connected" means that one feature is directly joined to or is in direct communication with another feature. Furthermore, although the various schematics shown herein depict certain example arrangement of elements, additional intervening elements, devices, features, or components may be present in an actual embodiment, assuming that the functionality of the given device, structure, or circuit is not adversely affected.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for fabricating an electrical or electronic apparatus using radiation annealing, the method comprising:
   forming an electrically activatable annealable layer on a substrate;
   forming a radiation absorbing layer on the substrate, wherein the radiation absorbing layer heats up in response to radiation, and the radiation absorbing layer is permanently formed adjacent to at least a portion of the annealable layer and non-adjacent to a portion of the electrical or electronic apparatus, wherein the annealable layer and the radiation layer are included in a first pair of layers;
   forming at least one additional pair of layers on the substrate, wherein each additional pair of layers includes another annealable layer and another radiation absorbing layer;
   directing radiation toward the electrical or electronic apparatus to, for each pair of layers, heat up the radiation absorbing layer to anneal the at least a portion of the annealable layer that is adjacent to the radiation absorbing layer without annealing the portion of the apparatus that is non-adjacent to the radiation absorbing layer.

2. The method of claim 1, wherein for at least one pair of layers the radiation absorbing layer is formed in a different Cartesian coordinate plane than the annealable layer such the radiation absorbing layer is formed perpendicular to a major surface of the annealable layer.

3. The method of claim 1, wherein for at least one pair of layers the radiation absorbing layer is formed in a same Cartesian coordinate plane as the annealable layer such that the radiation absorbing layer is formed parallel to a major surface of the annealable layer.

4. The method of claim 1, wherein for at least one pair of layers the radiation absorbing layer is formed on the substrate before the annealable layer is formed on the substrate.

5. The method of claim 1, wherein for at least one pair of layers the radiation absorbing layer is formed on the substrate after the annealable layer is formed on the substrate.

6. The method of claim 1, wherein directing the radiation toward the apparatus comprises directing the radiation once after all of the pairs of layers are formed on the substrate.

7. The method of claim 1, wherein directing the radiation toward the apparatus comprises directing the radiation after each pair of layers is formed on the substrate.

8. The method of claim 1, wherein for at least one pair of layers the radiation absorbing layer is formed into a shape that includes at least one of:
   a zero-dimensional shape;
   a one-dimensional shape;
   a two-dimensional shape; or
   a three-dimensional shape.

9. A method for fabricating an electrical or electronic apparatus using radiation annealing, the method comprising:
   forming an electrically activatable first annealable layer on a substrate;
   forming a radiation absorbing layer on the substrate, wherein the radiation absorbing layer heats up in response to radiation, and the radiation absorbing layer is permanently formed adjacent to at least a portion of the first annealable layer and non-adjacent to a portion of the electrical or electronic apparatus, wherein forming the radiation absorbing layer on the substrate comprises positioning radiation absorbing material adjacent to a first portion of the first annealable layer and non-adjacent to a second portion of the first annealable layer, such that the first portion of the first annealable layer is annealed using the radiation without annealing the second portion of the first annealable layer;
   forming a second annealable layer on the substrate after the first annealable layer and the radiation absorbing layer are formed on the substrate, wherein the radiation absorbing layer has a higher radiation absorption capability than the second annealable layer, and wherein a first portion of the second annealable layer is positioned adjacent to the radiation absorbing material and a second portion of the second annealable layer is positioned non-adjacent to the radiation absorbing material;
   directing radiation toward the electrical or electronic apparatus to heat up the radiation absorbing layer to anneal the at least a portion of the first annealable layer that is adjacent to the radiation absorbing layer without annealing the portion of the apparatus that is non-adjacent to the radiation absorbing layer and such that the first portion of the second annealable layer is annealed using the radiation without annealing the second portion of the second annealable layer.

10. The method of claim 9, wherein positioning the radiation absorbing material adjacent to the first portion of the annealable layer and non-adjacent to the second portion of the annealable layer, for at least one of the first or second annealable layers, comprises shaping the radiation absorbing material.

11. The method of claim 9, wherein forming at least one of the first or second annealable layers on the substrate comprises shaping the annealable layer before positioning the radiation absorbing material adjacent to the first portion of the annealable layer and non-adjacent to the second portion of the annealable layer.

12. The method of claim 11, wherein the radiation absorbing material is positioned laterally to the first portion of the annealable layer.

13. The method of claim 11, wherein the radiation absorbing material is at least partially enclosed by the first portion of the annealable layer.

14. An apparatus comprising:
   a structure having an annealed section and a non-annealed section;
   susceptor material that is integral to the apparatus and permanently positioned adjacent to the annealed section such that the annealed and non-annealed sections are defined by a shape of the susceptor material, wherein the annealed section was formed from material that was annealed at a temperature at least partially due to heat from the susceptor material's exposure to radiation, wherein the annealed section and the susceptor material comprise multiple annealable layer and susceptor layer pairs.

15. The apparatus of claim 14, wherein the annealed section comprises at least one of:
   a semiconductor material having an electrically activated dopant;
   an annealed silicide layer;
   a first constituent layer bonded to a second constituent layer; or
   an annealed organic material.

16. The apparatus of claim 14, wherein the susceptor material is configured to absorb radiation to a greater degree than the material of the annealed section.

17. The apparatus of claim 16, wherein the susceptor material comprises a first susceptor layer that is configured with a first dielectric loss factor that generates a first absorption capability, which corresponds to a frequency of a first radiation used to generate the annealed section.

18. The apparatus of claim 17, wherein the susceptor material comprises a second susceptor layer that is configured with a second dielectric loss factor that generates a second absorption capability, which corresponds to a frequency of a second radiation used to generate the annealed section.

* * * * *